(12) United States Patent
Yamauchi et al.

(10) Patent No.: US 11,604,415 B2
(45) Date of Patent: Mar. 14, 2023

(54) SUBSTRATE PROCESSING METHOD, SUBSTRATE PROCESSING APPARATUS, AND COMPUTER READABLE RECORDING MEDIUM

(71) Applicant: Tokyo Electron Limited, Tokyo (JP)

(72) Inventors: Takashi Yamauchi, Kumamoto (JP); Shinichiro Kawakami, Kumamoto (JP); Masashi Enomoto, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/056,096

(22) PCT Filed: May 17, 2019

(86) PCT No.: PCT/JP2019/019806
§ 371 (c)(1),
(2) Date: Nov. 17, 2020

(87) PCT Pub. No.: WO2019/230462
PCT Pub. Date: Dec. 5, 2019

(65) Prior Publication Data
US 2021/0208504 A1    Jul. 8, 2021

(30) Foreign Application Priority Data

May 29, 2018  (JP) .............................. JP2018-102151
Nov. 14, 2018 (JP) .............................. JP2018-213910

(51) Int. Cl.
*G03F 7/16*    (2006.01)
*G03F 7/20*    (2006.01)
*H01L 21/027*  (2006.01)

(52) U.S. Cl.
CPC .............. *G03F 7/16* (2013.01); *G03F 7/2004* (2013.01); *H01L 21/027* (2013.01)

(58) Field of Classification Search
CPC .......... G03F 7/16; G03F 7/2004; G03F 7/168; G03F 7/20; G03F 7/38; H01L 21/027;
(Continued)

(56) References Cited

U.S. PATENT DOCUMENTS

2018/0254196 A1*  9/2018  Ishii ...................... H01L 21/461
2019/0084118 A1*  3/2019  Kubota ............. H01L 21/67219

FOREIGN PATENT DOCUMENTS

JP    S63-51640 A    3/1988
JP    H07-183199 A   7/1995
(Continued)

OTHER PUBLICATIONS

International Search Report dated Aug. 6, 2019 for WO 2019/230462 A1 (2 pages).

*Primary Examiner* — Hung V Nguyen
(74) *Attorney, Agent, or Firm* — Venjuris, P.C.

(57) ABSTRACT

A substrate processing method includes: forming a coating film on a substrate by supplying a resist liquid which is photosensitive to extreme ultraviolet (EUV) light to a surface of the substrate; forming a semi-solidified film by volatilizing a solvent contained in the coating film without heating the solvent; irradiating the semi-solidified film with EUV light thereby exposing the semi-solidified film with EUV light; and supplying a developer to the substrate after the exposure of the semi-solidified film.

19 Claims, 28 Drawing Sheets

(58) Field of Classification Search
CPC ........... H01L 21/67115; H01L 21/6715; H01L 21/67178; H01L 21/0274
See application file for complete search history.

(56) References Cited

FOREIGN PATENT DOCUMENTS

| | | |
|---|---|---|
| JP | 2007-072357 A | 3/2007 |
| JP | 2009-81182 A | 4/2009 |
| JP | 2014-123093 A | 7/2014 |
| JP | 2016-539361 A | 12/2016 |

\* cited by examiner

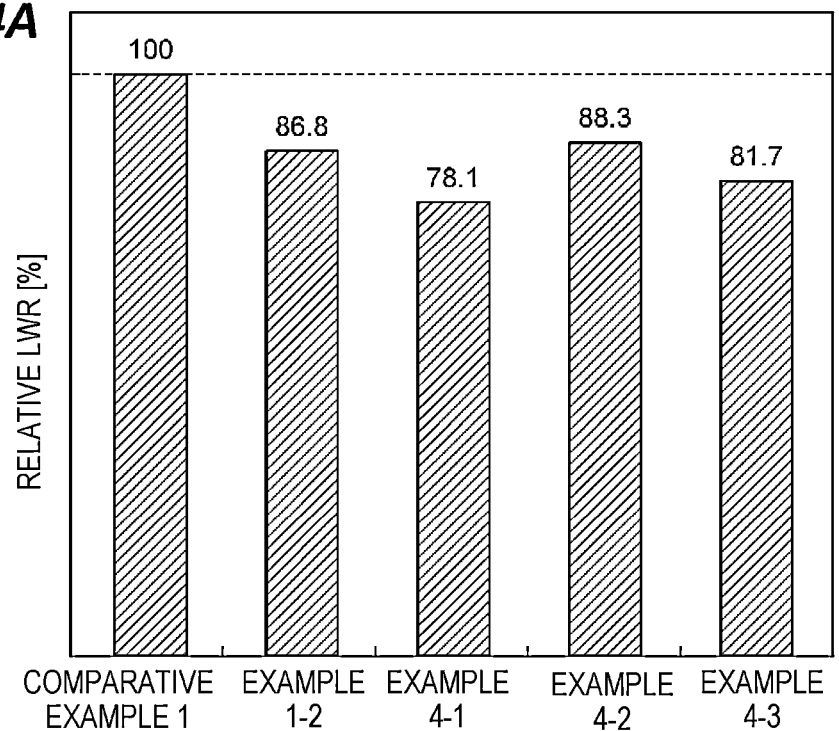
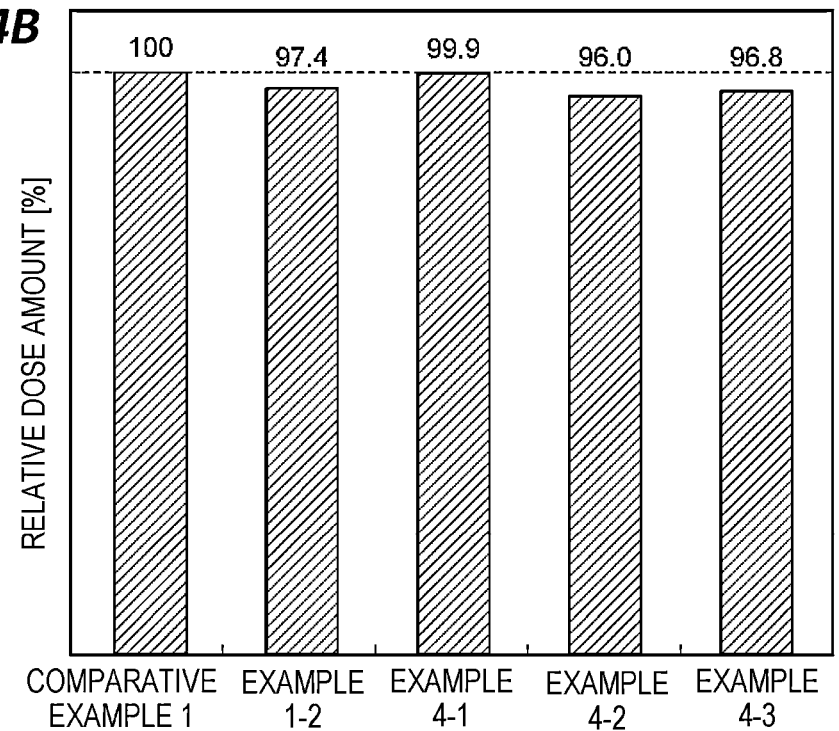

SUBSTRATE PROCESSING METHOD, SUBSTRATE PROCESSING APPARATUS, AND COMPUTER READABLE RECORDING MEDIUM

CROSS REFERENCE TO RELATED APPLICATIONS

This application is a national phase of PCT application No. PCT/JP2019/019806, filed on May 17, 2019, which claims priority from Japanese Patent Application Nos. 2018-102151 and 2018-213910, filed on May 29, 2018 and Nov. 14, 2018, respectively, all of which are incorporated herein by reference.

TECHNICAL FIELD

The present disclosure relates to a substrate processing method, a substrate processing apparatus, and a computer readable recording medium.

BACKGROUND

In an exposure process of a semiconductor device, a technology for forming a finer resist pattern is required as a circuit becomes highly integrated and the processing speed becomes higher. As one of the technologies, it has been proposed to use an irradiation source capable of irradiating a short wavelength energy ray. The short wavelength energy ray may include, for example, KrF excimer laser light, ArF excimer laser light, $F_2$ excimer laser light, ion beam, electron ray, X-ray, and extreme ultraviolet (EUV).

Patent Document 1 discloses a substrate processing method which includes irradiating a resist film with EUV light, developing the resist film after exposure to form an extremely fine resist pattern (e.g., 20 nm or less), and slimming the obtained resist pattern. As described above, the slimming processing is performed after the patterning, and thus, the line width roughness (LWR) of the resist pattern is improved.

PRIOR ART DOCUMENT

Patent Document

Patent Document 1: Japanese Patent Laid-Open Publication No. 2016-539361

SUMMARY OF THE INVENTION

Problem to be Solved

The present disclosure describes a substrate processing method, a substrate processing apparatus, and a computer readable recording medium capable of achieving both further improvement of LWR and improvement of productivity.

Means to Solve the Problem

A substrate processing method according to a viewpoint of the present disclosure includes forming a coating film by supplying a resist liquid photosensitive to extreme ultraviolet (EUV) light to a surface of a substrate, forming a semi-solidified film by volatilizing a solvent contained in the coating film without heating, irradiating the semi-solidified film with EUV light to expose the semi-solidified film, and supplying a developer to the substrate after the semi-solidified film is exposed.

Effect of the Invention

According to the substrate processing method, the substrate processing apparatus, and the computer readable recording medium according to the present disclosure, it is possible to achieve both further improvement of LWR and improvement of productivity.

BRIEF DESCRIPTION OF THE DRAWINGS

FIG. 24A is a graph illustrating a relative LWR of Example 1-2, Example 4-1 to 4-3, and Comparative Example 1, and FIG. 24B is a graph illustrating a relative dose amount of Example 1-2, Example 4-1 to 4-3, and Comparative Example 1.

DETAILED DESCRIPTION TO EXECUTE THE INVENTION

Figure 1:
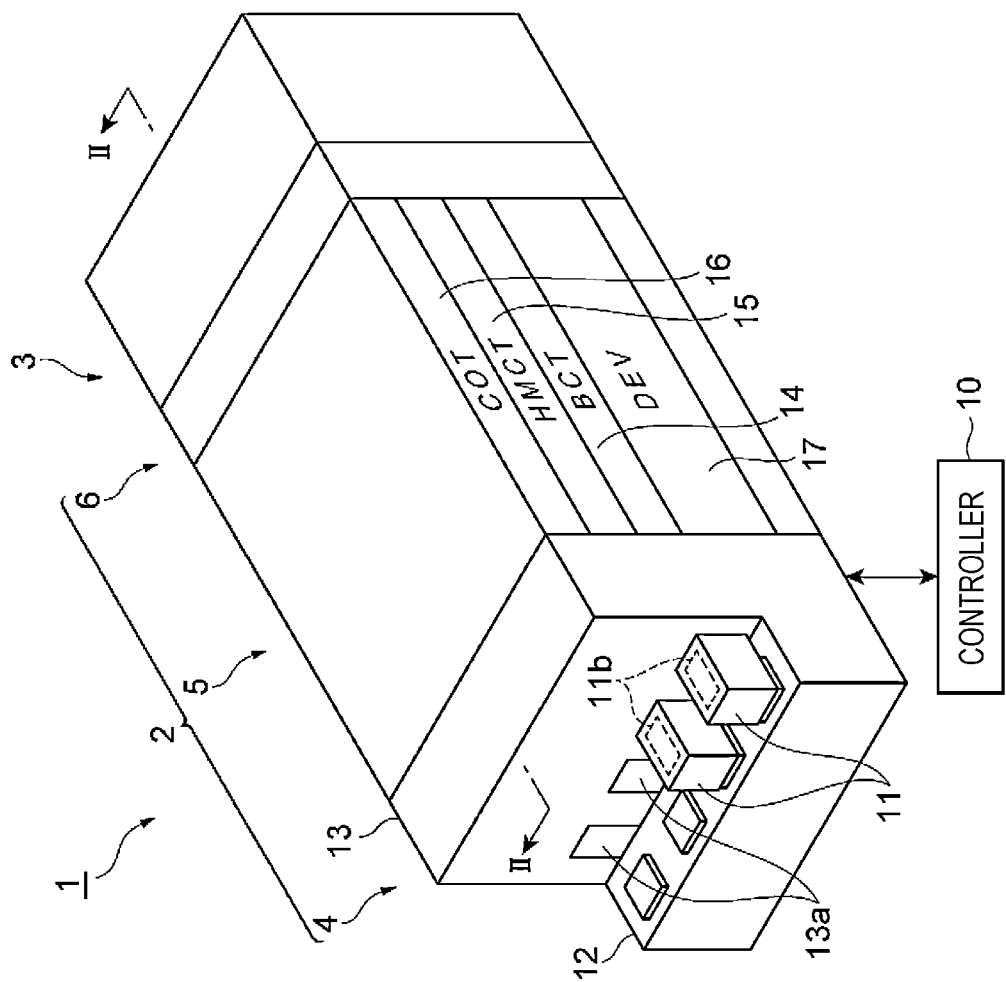
FIG. 1 is a perspective view illustrating an example of a substrate processing system.

Hereinafter, an example of an embodiment according to the present disclosure will be described in more detail with reference to the drawings. In the descriptions below, the same elements or elements having the same function are denoted by the same reference numerals, and redundant descriptions thereof will be omitted.

[Substrate Processing System]

As illustrated in FIG. 1, a substrate processing system 1 (substrate processing apparatus) includes a coating and developing device 2 (substrate processing device), an exposure device 3, and a controller 10 (control unit).

Figure 5:
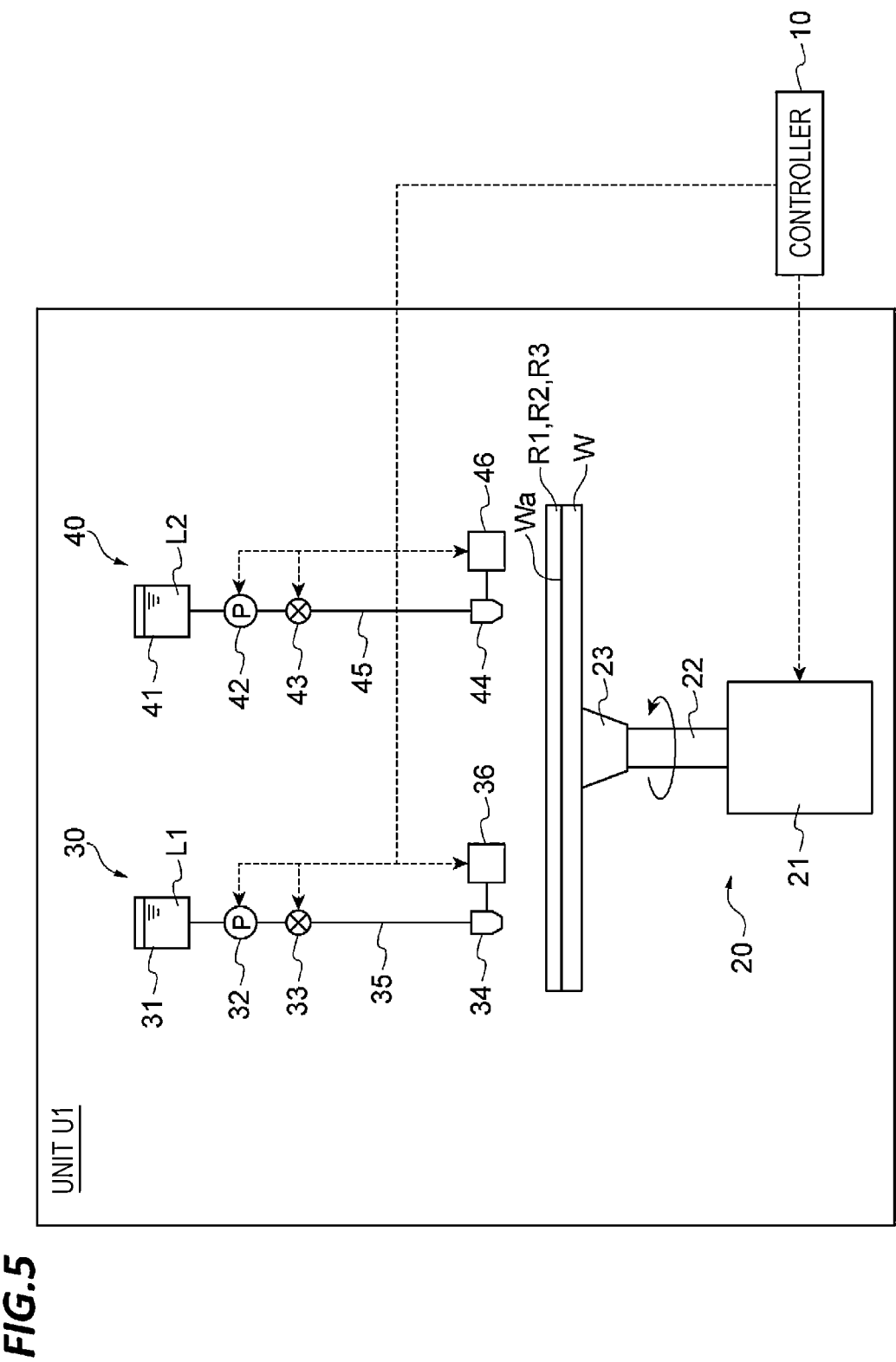
FIG. 5 is a schematic view illustrating a liquid processing unit.
Figure 8A:
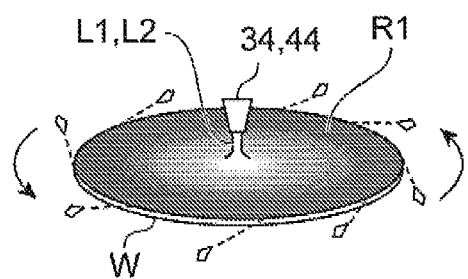
FIGS. 8A to 8E are schematic views for explaining a forming process of a resist pattern.
Figure 8B:
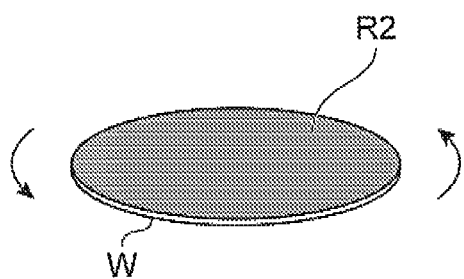
Figure 8C:
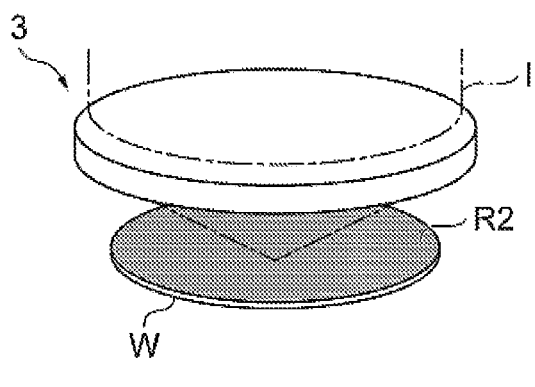

The exposure device 3 is configured to perform an exposure processing (pattern exposure) of a resist film formed on a surface Wa of a wafer W (substrate) (see FIG. 5). Specifically, an exposure target portion of the resist film (photosensitive film) is selectively irradiated with radiation I (see FIG. 8C) by a method such as immersion exposure.

The radiation I irradiated in the exposure device 3 may include, for example, ionizing irradiation or non-ionizing radiation. The ionizing radiation is radiation that has sufficient energy to ionize atoms or molecules. The ionizing radiation may include, for example, EUV (wavelength: 13.5 nm), electron ray, ion beam, X-ray, α-ray, β-ray, γ-ray, heavy particle ray, proton ray. The non-ionizing radiation is radiation that does not have sufficient energy to ionize atoms or molecules. The non-ionizing radiation may include, for example, KrF excimer laser light (wavelength: 248 nm), ArF excimer laser light (wavelength: 193 nm), $F_2$ excimer laser light (wavelength: 157 nm), and far ultraviolet (wavelength: 190 nm to 300 nm).

The coating and developing device 2 performs a processing of forming a resist film of the surface Wa of the waver W before the exposing processing by the exposure device 3, and performs a processing of developing the resist film after the exposing processing. The wafer W may have a disc shape or may be a circle, a part of which may be cut out, or the wafer W may have a shape other than a circle such as a polygon. The wafer W may be, for example, a semiconductor substrate, a glass substrate, a mask substrate, a flat panel display (FPD) substrate, or other various substrates. The diameter of the wafer W may be, for example, 200 mm to 450 mm.

As illustrated in FIGS. 1 to 4, the coating and developing device 2 includes a carrier block 4, a processing block 5, and an interface block 6. The carrier block 4, the processing block 5, and the interface block 6 are arranged in a horizontal direction.

Figure 3:
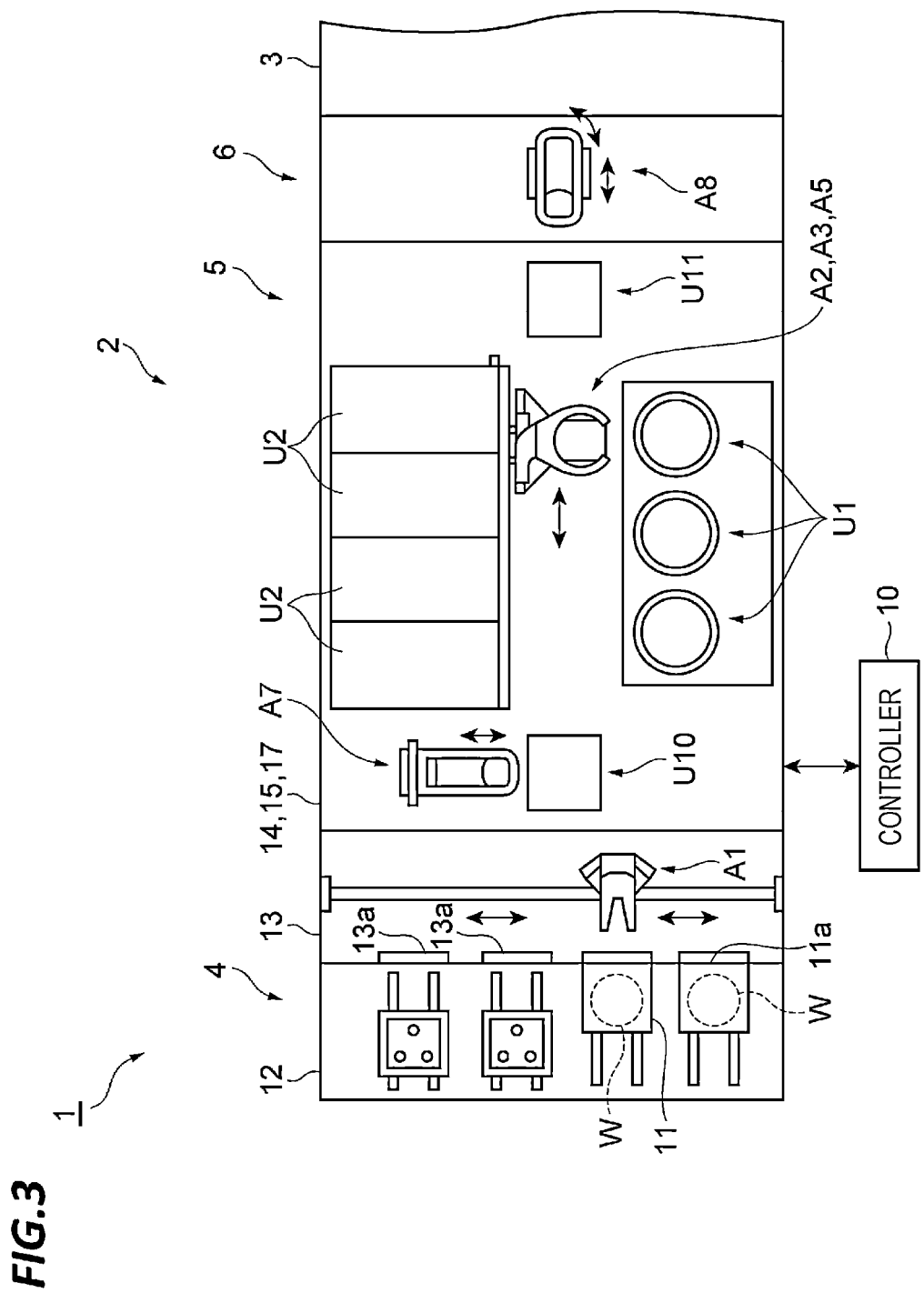
FIG. 3 is a top view illustrating a processing module (BCT module, HMCT module, and DEV module).
Figure 4:
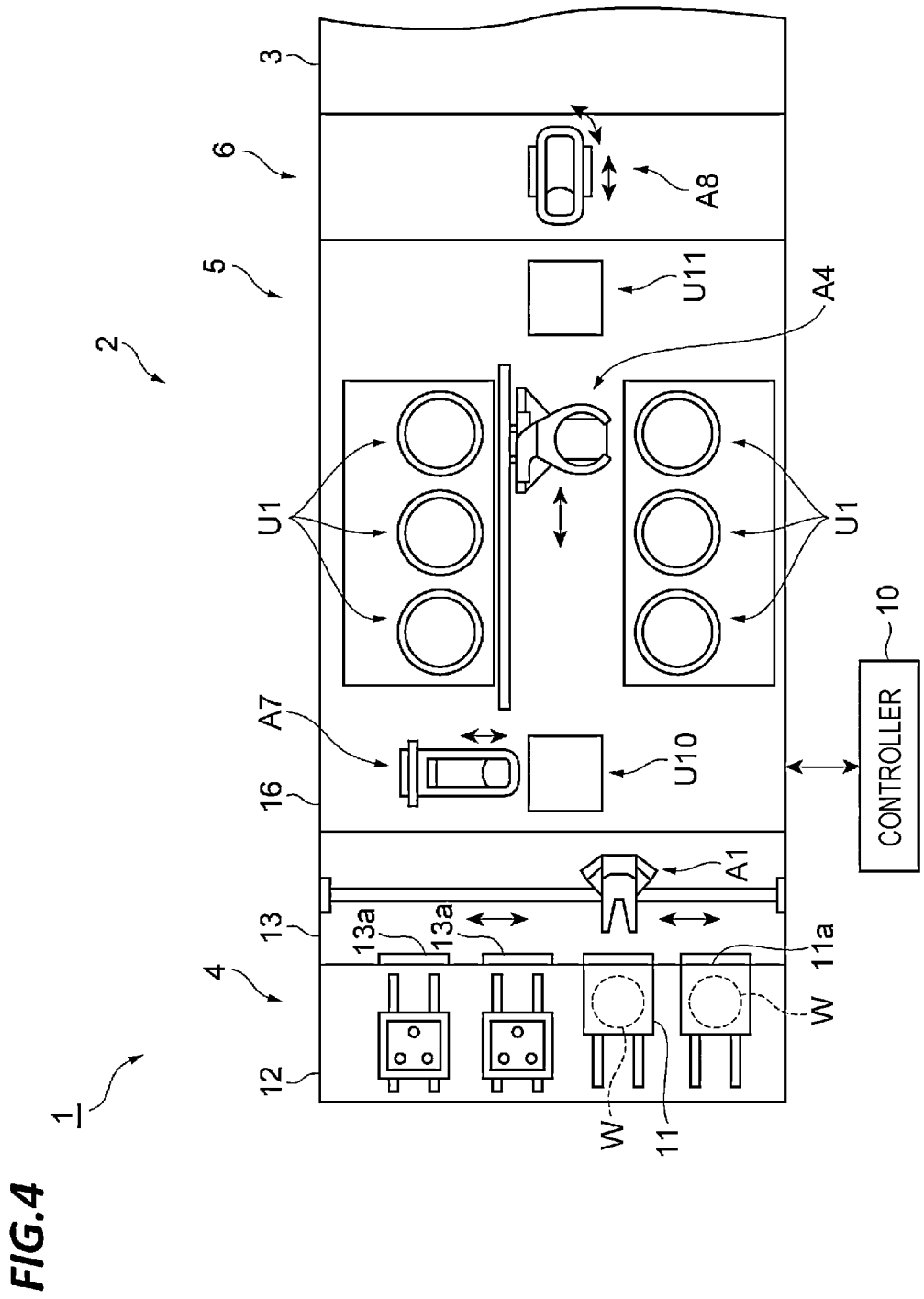
FIG. 4 is a top view illustrating a processing module (COT module).

As illustrated in FIGS. 1, 3, and 4, the carrier block 4 includes a carrier station 12 and a carry-in/out portion 13. The carrier station 12 supports a plurality of carriers 11. A carrier 11 accommodates at least one wafer W in a sealed state. An opening/closing door (not illustrated) is provided in a side surface 11a of the carrier 11 to load/unload the wafer W. The carrier 11 is detachably provided on the carrier station 12 such that the side surface 11a faces the carry-in/out portion 13.

The carry-in/out portion 13 is positioned between the carrier station 12 and the processing block 5. The carry-in/out portion 13 includes a plurality of opening/closing doors 13a. When the carrier 11 is disposed on the carrier station 12, the opening/closing door of the carrier 11 faces the opening/closing door 13a. When the opening/closing door 13a and the opening/closing door of the side surface 11a are opened at the same time, the inside of the carrier 11 and the inside of the carry-in/out portion 13 communicate with each other. The carry-in/out portion 13 incorporates a transfer arm A1. The transfer arm A1 is configured to take out the wafer W from the carrier 11, deliver the wafer W to the processing block 5, receive the wafer W from the processing block 5, and return the wafer W to the inside of the carrier 11.

As illustrated in FIGS. 1 to 4, the carrier block 4 includes processing modules 14 to 17. The processing modules are arranged in the order of the processing module 17, the processing module 14, the processing module 15, and the processing module 16 from the bottom surface side.

Figure 2:
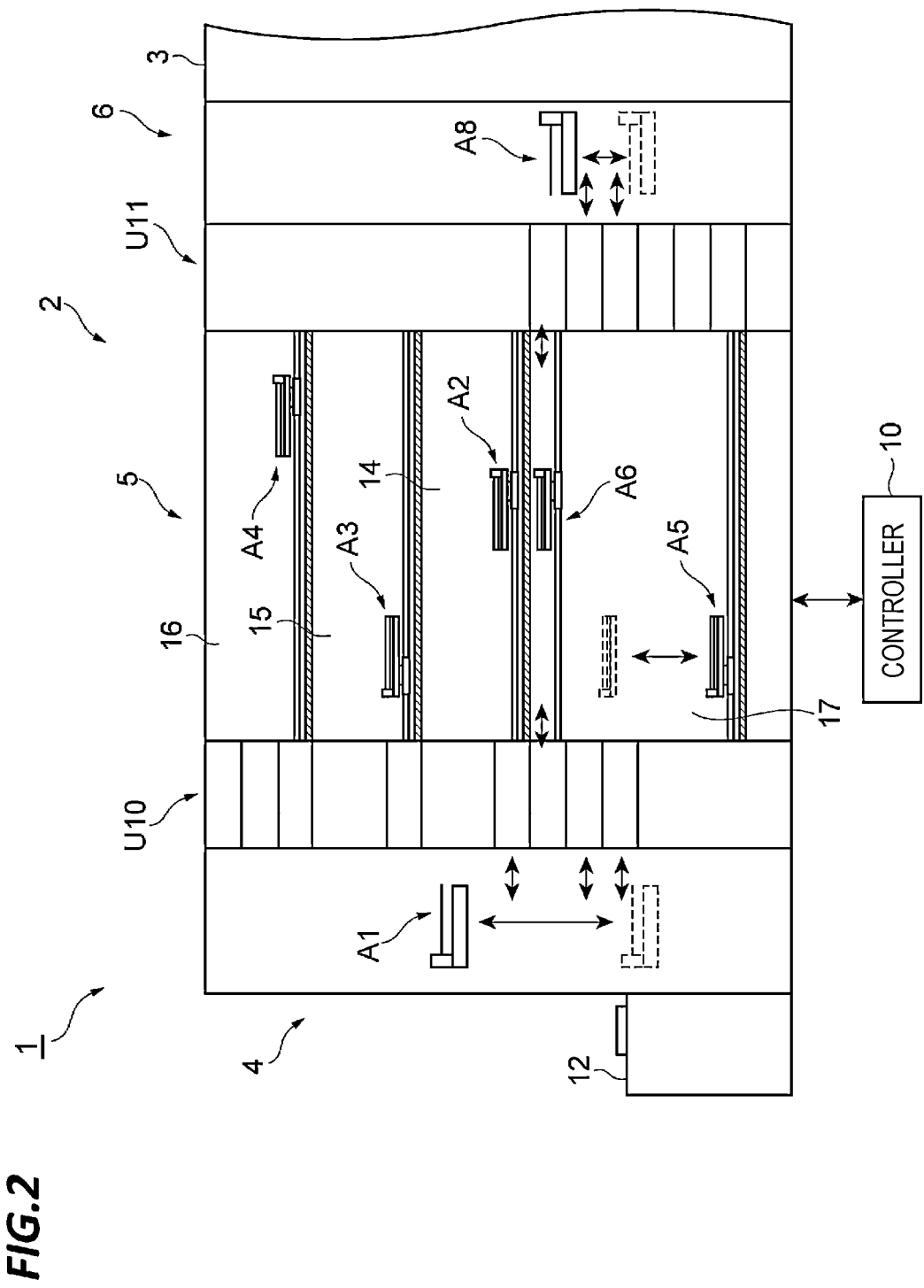
FIG. 2 is a cross-sectional view taken along line II-II in FIG. 1.

The processing module 14 is configured to form a lower layer film on the surface Wa of the wafer W, and is also referred to as a BCT module. As illustrated in FIGS. 2 and 3, the processing module 14 incorporates a plurality of coating units U1, a plurality of heat treatment units U2, and a transfer arm A2 that transfers the wafer W to these units U1 and U2. The unit U1 of the processing module 14 is configured to apply a coating liquid for the lower layer film formation onto the surface Wa of the wafer W to form a coating film. The unit U2 of the processing module 14 is configured to perform a heat treatment in which the wafer W is heated by, for example, a heating plate, and the heated wafer W is cooled by, for example, a cooling plate. A specific example of the heat treatment performed in the processing module 14 may include a heating processing in which the coating film is cured to form the lower layer film. The lower layer film may include, for example, a silicon-containing antireflection coating (SiARC) film.

The processing module 15 is configured to form an intermediate film (hard mask) on the lower layer film, and is also referred to as an HMCT module. As illustrated in FIGS. 2 and 3, the processing module 15 incorporates a plurality of coating units U1, a plurality of heat treatment units U2, and a transfer arm A3 that transfers the wafer W to these units U1 and U2. The unit U1 of the processing module 15 is configured to apply a coating liquid for the intermediate film formation onto the lower layer film of the wafer W to form a coating film. The unit U2 of the processing module 15 is configured to perform a heat treatment in which the wafer W is heated by, for example, a heating plate, and the heated wafer W is cooled by, for example, a cooling plate. Specific examples of the heat treatment performed in the processing module 15 may include a heating processing in which the coating film is cured to form the intermediate film. The intermediate film may include, for example, a spin-on-carbon (SOC) film and an amorphous carbon film.

The processing module 16 is configured to form a thermosetting and photosensitive resist film on the intermediate film, and is called a COT module. As illustrated in FIGS. 2 and 4, the processing module 16 incorporates a plurality of coating units U1 and a transfer arm A4 that transfers the wafer W to the unit U1. The unit U1 of the processing module 16 is configured to apply the coating liquid (resist liquid) for the resist film formation onto the intermediate film to form a coating film R1 (see FIG. 8A). That is, the coating film R1 is provided in the surface Wa of the wafer W.

Figure 8D:
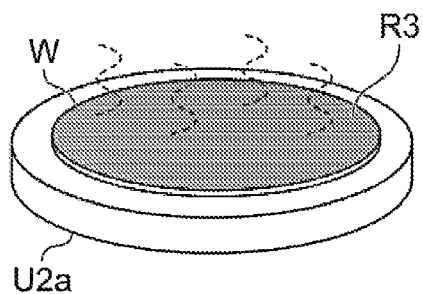
Figure 8E:
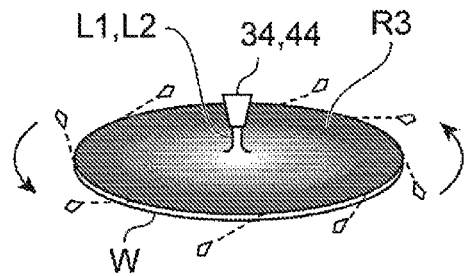
Figure 9:
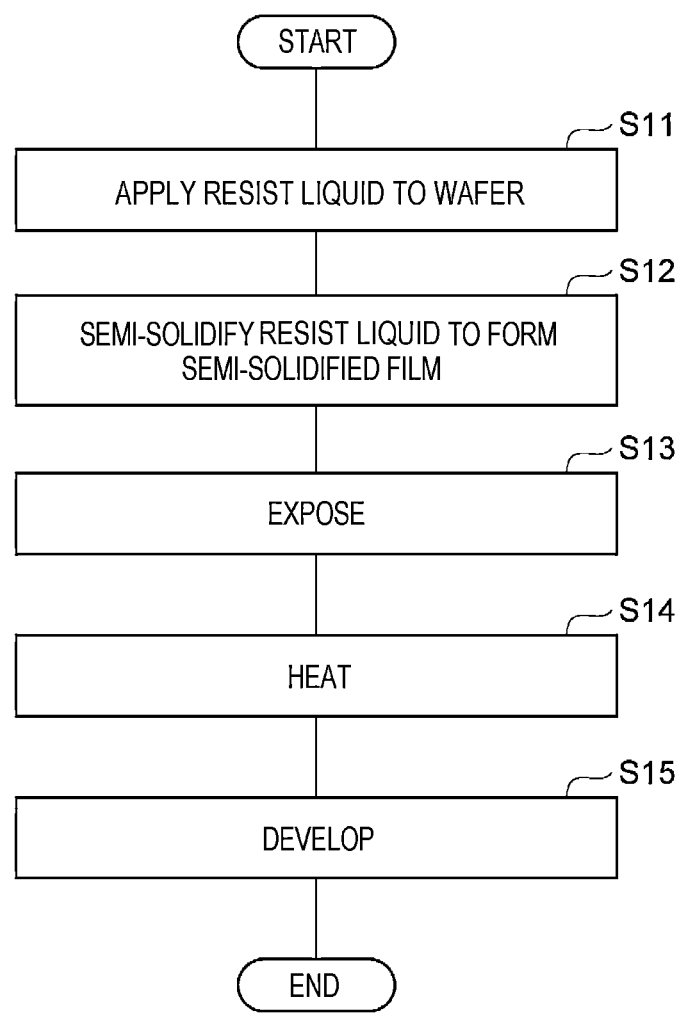
FIG. 9 is a flowchart for explaining the forming process of the resist pattern.

The processing module 17 (developing unit) is configured to perform a processing of developing the exposed resist film, and is also referred to as a DEV module. As illustrated in FIGS. 2 and 3, the processing module 17 incorporates a plurality of developing units U1, a plurality of heat treatment units U2 (heating units), a transfer arm A5 that transfers the wafer W to these units U1 and U2, and a transfer arm A6 that directly transfers the wafer W between shelf units U11 and U10 (will be described later) without passing through these units U1 and U2. The unit U1 of the processing module 17 is configured to partially remove the resist film to form a resist pattern. The unit U2 of the processing module 17 is configured to perform a heat treatment in which the wafer W is heated by, for example, a heating plate U2a (see FIG. 8D), and the heated wafer W is cooled by, for example, a cooling plate. Specific examples of the heat treatment performed in the processing module 17 includes, for example, a heating processing (post exposure bake; PEB) before the developing processing and a heating processing (post bake; PB) after the developing processing.

As illustrated in FIGS. 2 to 4, the shelf unit U10 is provided on the carrier block 4 side in the processing block 5. The shelf unit U10 is provided from the bottom surface to the processing module 15, and is divided into a plurality of cells arranged in the vertical direction. A transfer arm A7 is provided in the vicinity of the shelf unit U10. The transfer arm A7 moves the wafer W up and down between the cells of the shelf unit U10.

The shelf unit U11 is provided on the interface block 6 side in the processing block 5. The shelf unit U11 is provided from the bottom surface to the upper portion of the processing module 17, and is divided into a plurality of cells arranged in the vertical direction.

The interface block 6 incorporates a transfer arm A8, and is connected to the exposure device 3. The transfer arm A8 is configured to take out the wafer W of the shelf unit U11 to deliver the wafer W to the exposure device 3, and receive the wafer W from the exposure device 3 to return the wafer W to the shelf unit U11.

The controller 10 partially or entirely controls the substrate processing system 1. Details of the controller 10 will be described later.

[Configuration of Liquid Processing Unit]

Subsequently, the liquid processing unit U1 will be described in more detail with reference to FIG. 5. As illustrated in FIG. 5, the unit U1 includes a rotation holder 20 (volatilizing unit), a liquid supply 30, and a liquid supply 40 (polar solvent supply).

The rotation holder 20 includes a rotating unit 21, a shaft 22, and a holder 23. The rotating unit 21 is operated based on an operation signal from the controller 10 to rotate the shaft 22. The rotating unit 21 is, for example, a power source such as an electric motor. The holder 23 is provided in the tip end portion of the shaft 22. The wafer W is disposed on the holder 23. The holder 23 holds the wafer W substantially horizontally by, for example, adsorption. That is, the rotation holder 20 rotates the wafer W around a center axis Ax (rotating axis) vertical with respect to the surface Wa of the wafer W in a state where the posture of the wafer W is substantially horizontal. In the example in FIG. 5, the rotation holder 20 rotates the wafer W at a predetermined rotation speed clockwise when viewed from the above.

The liquid supply 30 is configured to supply a processing liquid L1 to the surface Wa of the wafer W. In the processing modules 14 and 15, the processing liquid L1 is various coating liquids for forming the lower layer film or the intermediate film. In the processing module 16, the processing liquid L1 is a resist liquid for forming a coating film R1. In this case, the liquid supply 30 functions as a resist liquid supply. In the processing module 17, the processing liquid L1 is a developer. In this case, the liquid supply 30 functions as a developer supply.

The resist liquid L may contain a photosensitive resist material (e.g., chemically amplified resist material). The chemically amplified resist material mainly includes a base component and a photo acid generator (PAG). The resist material contained in the resist liquid L may be a positive type resist material or a negative type resist material. The positive type resist material is a resist material in which the exposed pattern portion is melted and the unexposed pattern portion (light-shielding portion) remains. The negative type resist material is a resist material in which the unexposed portion is melted and the exposed portion (light-shielding portion) remains.

The liquid supply 30 includes a liquid source 31, a pump 32, a valve 33, a nozzle 34, a pipe 35, and a driving mechanism 36. The liquid source 31 functions as a supply source of the processing liquid L1. The pump 32 is operated based on an operation signal from the controller 10 to suck the processing liquid L1 from the liquid source 31 and send the processing liquid L1 to the nozzle 34 via the pipe 35 and the valve 33.

The nozzle 34 is disposed above the wafer W so that the discharge port faces the surface Wa of the wafer W. The nozzle 34 may discharge the processing liquid L1 sent from the pump 32 to the surface Wa of the wafer W. The pipe 35 sequentially connects the liquid source 31, the pump 32, the valve 33, and the nozzle 34 from the upstream side. The driving mechanism 36 is configured to be operated based on an operation signal from the controller 10 to move the nozzle 34 in the horizontal direction and the vertical direction.

The liquid supply 40 is configured to supply a processing liquid L2 to the surface Wa of the wafer W. In the processing modules 14 and 15, the processing liquid L2 is various organic solvents for partially removing the lower layer film or the intermediate film from the wafer W. In this case, the liquid supply 40 functions as a solvent supply. In the processing module 16, the processing liquid L2 is a polar solvent. In this case, the liquid supply 40 functions as a polar solvent supply. In the processing module 17, the processing liquid L2 is a rinse liquid. In this case, the liquid supply 40 functions as a rinse liquid supply.

The polar solvent may be a liquid having a dipole moment. The dipole moment of the polar solvent may be larger than 0 debyes, 1.5 debyes to 3.5 debyes, 1.5 debyes to 2.75 debyes, or 1.75 debyes to 2.75 debyes. The polar solvent may be a liquid contained as a solvent in the developer or the rinse liquid, and may be, for example, pure water (deionized water; DIW), isopropyl alcohol, 2-heptanone, or n-butyl alcohol. The dipole moment of pure water is approximately 1.94 debyes. The dipole moment of isopropyl alcohol is approximately 1.68 debyes. The dipole moment of 2-heptanone is approximately 2.59 debyes. The dipole moment of n-butyl alcohol is approximately 1.84 debyes.

The liquid supply 40 includes a liquid source 41, a pump 42, a valve 43, a nozzle 44, a pipe 45, and a driving mechanism 46. The liquid source 41 functions as a supply source of the processing liquid L2. The pump 42 sucks the processing liquid L2 from the liquid source 41 and sends the processing liquid L2 to the nozzle 44 via the pipe 45 and the valve 43.

The nozzle 44 is disposed above the wafer W so that the discharge port faces the surface Wa of the wafer W. The nozzle 44 may discharge the processing liquid L2 sent from the pump 42 to the surface Wa of the wafer W. The pipe 45 sequentially connects the liquid source 41, the pump 42, the valve 43, and the nozzle 44 from the upstream side. The driving mechanism 46 is configured to be operated based on an operation signal from the controller 10 to move the nozzle 44 in the horizontal direction and the vertical direction.

[Configuration of Controller]

Figure 6:
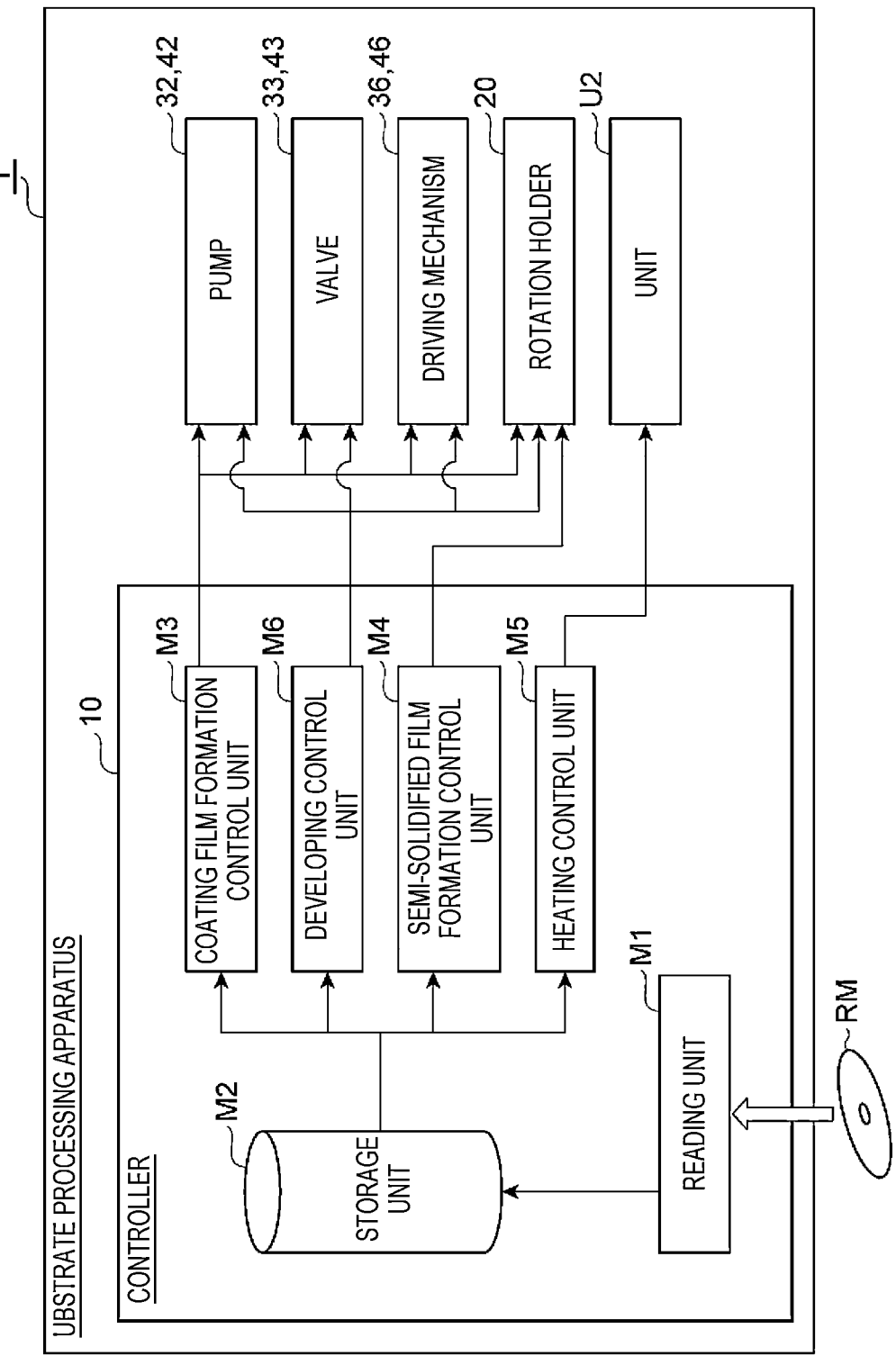
FIG. 6 is a block view illustrating a main part of the substrate processing system.

As illustrated in FIG. 6, the controller 10 includes a reading unit M1, a storage unit M2, a coating film formation control unit M3, a semi-solidified film formation control unit M4, a heating control unit M5, and a developing control unit M6 as functional modules. The functional modules are merely divisions of the functions of the controller 10 into a plurality of modules for convenience, and do not necessarily mean that the hardware that constitutes the controller 10 is divided into such modules. Each of the functional modules is not limited to be implemented by executing a program, but may be implemented by a dedicated electric circuit (e.g., logic circuit) or an integrated circuit (application specific integrated circuit; ASIC) that integrates the electric circuit.

The reading unit M1 has a function of reading a program from a computer readable recording medium RM. The recording medium RM records a program for operating each part of the substrate processing system 1. The recording medium RM may include, for example, a semiconductor memory, an optical recording disk, a magnetic recording disk, or an optical magnetic recording disk.

The storage unit M2 has a function of storing various data. The storage unit M2 stores, for example, a program read from the recording medium RM by the reading unit M1, various data (so-called processing recipe) during the processing of the wafer W, and setting data input from an operator via an external input device (not illustrated).

The coating film formation control unit M3 has a function of controlling the rotation holder 20 so as to rotate the wafer W disposed on the holder 23. The coating film formation control unit M3 has a function of controlling the pumps 32 and 42, the valves 33 and 43, and the driving mechanisms 36 and 46 so as to supply the resist liquid and the polar solvent to the surface Wa of the wafer W being rotated, in order to form the coating film R1 on the surface Wa of the wafer W.

The semi-solidified film formation control unit M4 has a function of controlling the rotation holder 20 so as to rotate the wafer W disposed on the holder 23, so that the coating film becomes a semi-solidified film R2 (see FIG. 8B) by volatilizing a part or all of the solvent contained in the coating film R1 formed on the surface Wa.

The heating control unit M5 has a function of controlling the unit U2 of the processing module 17 so as to heat the semi-solidified film R2 after the exposure.

The developing control unit M6 has a function of controlling the pumps 32 and 42, the valves 33 and 43, and the driving mechanisms 36 and 46 so as to supply the developer and the rinse liquid toward the surface Wa of the wafer W being rotated, after the semi-solidified film R2 is heated.

Figure 7:
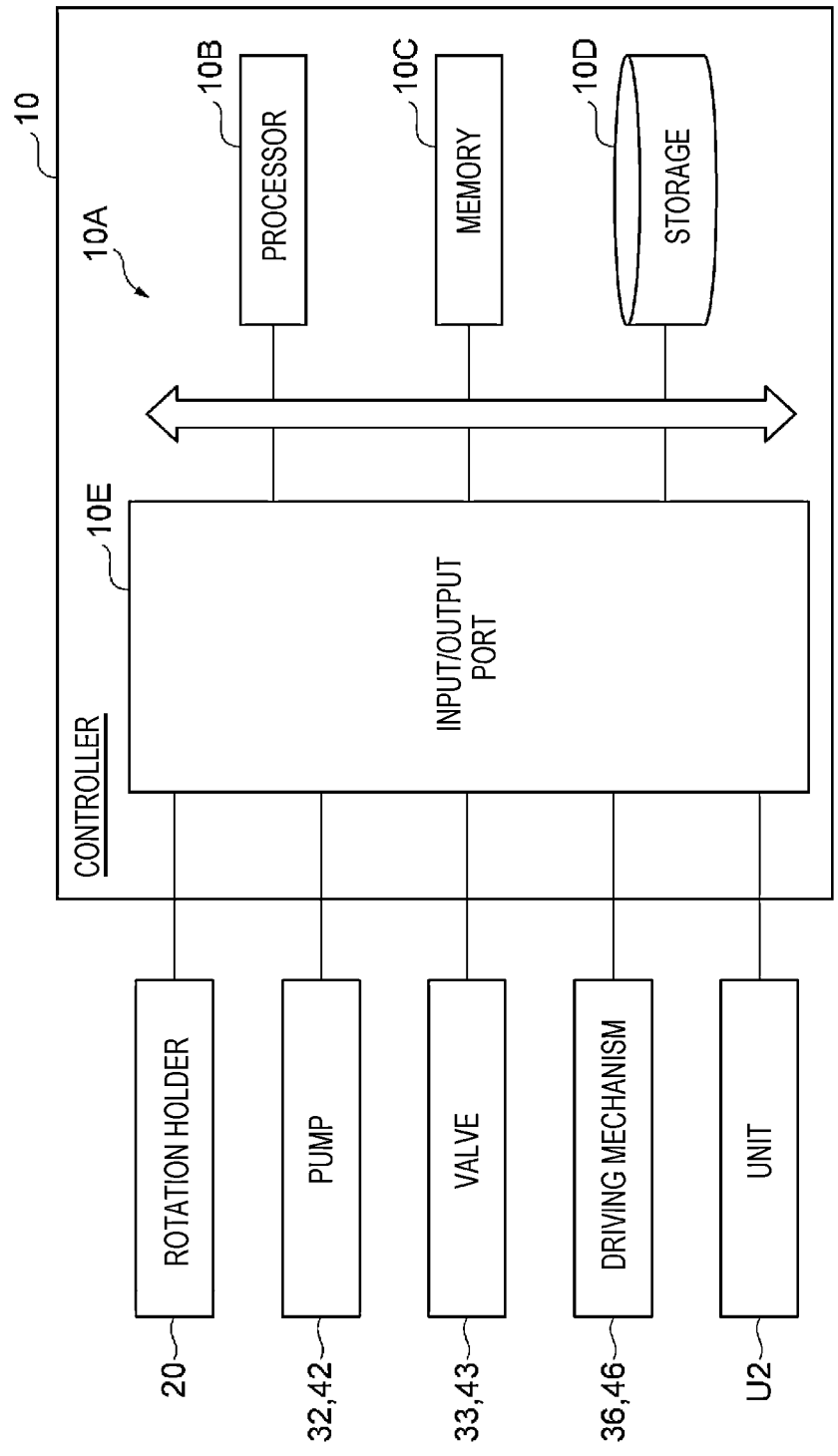
FIG. 7 is a schematic view illustrating a hardware configuration of a controller.

The hardware of the controller 10 is constituted by, for example, one or more control computers. The controller 10 includes, for example, a circuit 10A illustrated in FIG. 7 as a hardware configuration. The circuit 10A may be constituted by an electric circuit element (circuitry). The circuit 10A includes, specifically, a processor 10B, a memory 10C (storage unit), a storage 10D (storage unit), and an input/output port 10E. The processor 10B constitutes each of the functional modules described above by executing a program in cooperation with at least one of the memory 10C and the storage 10D, and executing input/output of a signal via the input/output port 10E. The input/output port 10E inputs/outputs the signal between the processor 10B, the memory 10C, and the storage 10D and various devices of the substrate processing system 1.

In the embodiment, the substrate processing system 1 includes one controller 10, but may include a controller group (control unit) constituted by a plurality of controllers 10. When the substrate processing system 1 includes the controller group, the functional modules described above may be implemented by one controller 10, respectively, or may be implemented by a combination of two or more controllers 10. When the controller 10 is constituted by a plurality of computers (circuits 10A), the functional modules described above may be implemented by one computer (circuit 10A), respectively, or may be implemented by a combination of two or more computers (circuits 10A). The controller 10 may include a plurality of processors 10B. In this case, the functional modules described above may be implemented by one or the plurality of processors 10B, respectively.

[Substrate Processing Method]

Subsequently, a method (substrate processing method) for forming a resist pattern on the surface Wa of the wafer W will be described with reference to FIGS. 8A to 8E and FIG. 9. Each processing below may be executed at approximately 20° C. to 30° C. (room temperature), or may be executed at approximately 23° C.

First, the controller 10 controls each part of the substrate processing system 1 to transfer the wafer W from the carrier 11 to the unit U1 of the processing module 16. Prior to this, the controller 10 may control each part of the substrate processing system 1 to transfer the wafer W to the processing modules 14 and 15, and form the lower layer film and the intermediate film on the surface Wa of the wafer W.

Subsequently, the controller 10 (coating film formation control unit M3) controls the rotation holder 20 to hold the wafer W by the holder 23 and rotate the wafer W at a predetermined rotation speed. The rotation speed at this time may be, for example, approximately 10 rpm to 4,000 rpm. The rotation time of the wafer W may be, for example, approximately 5 seconds to 180 seconds.

In this state, the controller 10 (coating film formation control unit M3) controls the pumps 32 and 42, the valves 33 and 43, and the driving mechanisms 36 and 46 to move the nozzles 34 and 44 above the surface Wa of the wafer W and discharge the resist liquid and the polar solvent from the nozzles 34 and 44 to the surface Wa of the wafer W. Therefore, the mixed liquid of the polar solvent and the resist liquid widely spread over the entire surface Wa of the wafer W, and the coating film R1 containing the polar solvent is formed on the surface Wa (see FIG. 8A and step S11 of FIG. 9). When the resist liquid having photosensitivity to EUV light is used, the film thickness of the coating film R1 at this time may be 50 nm or less, or 35 nm or less. The mixing ratio of the polar solvent and the resist liquid may be 5 parts by weight to 25 parts by weight or 10 parts by weight to 20 parts by weight of the polar solvent with respect to 100 parts by weight of the resist liquid.

Subsequently, the controller 10 (semi-solidified film formation control unit M4) controls the rotation holder 20 to rotate the wafer W held by the holder 23 at a predetermined rotation speed. The rotation speed at this time may be, for example, approximately 10 rpm to 4,000 rpm. The rotation time of the wafer W may be, for example, approximately 5 seconds to 180 seconds. Therefore, a part or all of the solvent contained in the coating film R1 formed on the surface Wa of the wafer W is volatilized, and the fluidity of the coating film R1 is significantly reduced. That is, the coating film R1 is semi-solidified without heating to become the semi-solidified film R2 (see FIG. 8B and step S12 in FIG. 9). The rotation of the wafer W for the coating film R1 to become the semi-solidified film R2 may be performed subsequent to the supply of the polar solvent and the resist liquid to the wafer W.

Subsequently, the controller 10 controls each part of the substrate processing system 1 to transfer the wafer W from the processing module 16 to the exposure device 3. Subsequently, a controller other than the controller 10 controls the exposure device 3 to irradiate the semi-solidified film R2 formed on the surface Wa of the wafer W with the radiation I. Therefore, the semi-solidified film R2 is exposed in a predetermined pattern (see FIG. 8C and step S13 in FIG. 9). At this time, when the resist liquid supplied to the wafer W contains a chemically amplified resist material, acid is generated in the semi-solidified film R2 by the exposure.

Subsequently, the controller 10 controls each part of the substrate processing system 1 to transfer the wafer W from the exposure device 3 to the unit U2 of the processing module 17. Subsequently, the controller 10 (heating control unit M5) controls the heating plate U2a of the unit U2 to heat (PEB) the wafer W disposed on the heating plate U2a. The heating temperature and the heating time at this time may be set such that the acid existing in the semi-solidified film R2 is diffused. Specifically, the heating temperature at this time may be room temperature or higher, approximately 40° C. to 110° C., or approximately 60° C. to 90° C. The heating time at this time may be 60 seconds or more, or approximately 90 seconds to 120 seconds. Therefore, the semi-solidified film R2 is solidified to become a solidified film R3 (resist film) (see FIG. 8D and step S14 in FIG. 9).

Subsequently, the controller 10 controls each part of the substrate processing system 1 to transfer the wafer W from the unit U2 of the processing module 17 to the unit U1 of the processing module 17. Subsequently, the controller 10 (developing control unit M6) controls the rotation holder 20 to hold the wafer W by the holder 23 and rotate the wafer W at a predetermined rotation speed. The rotation speed at this time may be, for example, approximately 10 rpm to 4,000 rpm. The rotation time of the wafer W may be, for example, approximately 5 seconds to 180 seconds.

In this state, the controller 10 (developing control unit M6) controls the pump 32, the valve 33, and the driving mechanism 36 to move the nozzle 34 above the surface Wa of the wafer W and discharge the developer from the nozzle 34 to the surface Wa of the wafer W. Therefore, the developer widely spreads over the entire solidified film R3, and the solidified film R3 reacts with the developer to dissolve a predetermined portion. Subsequently, the controller 10 (developing control unit M6) controls the pump 42, the valve 43, and the driving mechanism 46 to move the nozzle 44 above the surface Wa of the wafer W and discharge the rinse liquid from the nozzle 44 to the surface Wa of the wafer W. Therefore, the dissolved substances of the resist dissolved in the reaction with the developer in the solidified film R3 is washed away by the rinse liquid (see FIG. 8E and step S15 in FIG. 9). In this manner, a resist pattern is formed on the surface Wa of the wafer W.

[Effect]

Figure 10A:
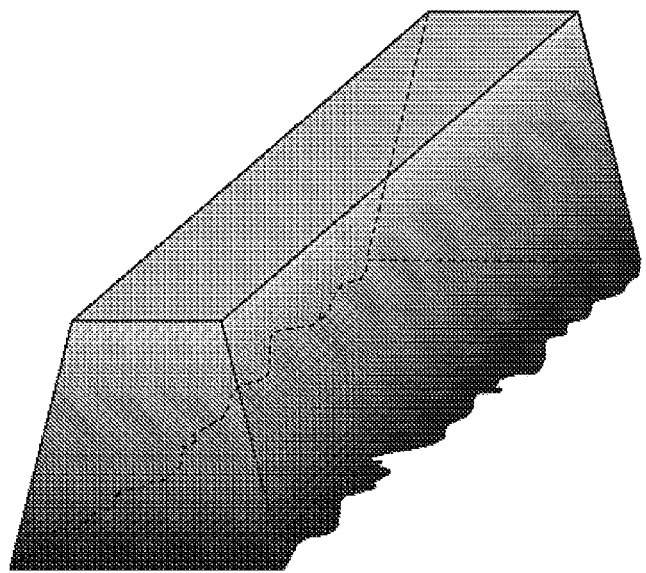
FIG. 10A is a schematic perspective view of a resist pattern formed through a pre applied bake (PAB)
Figure 10B:
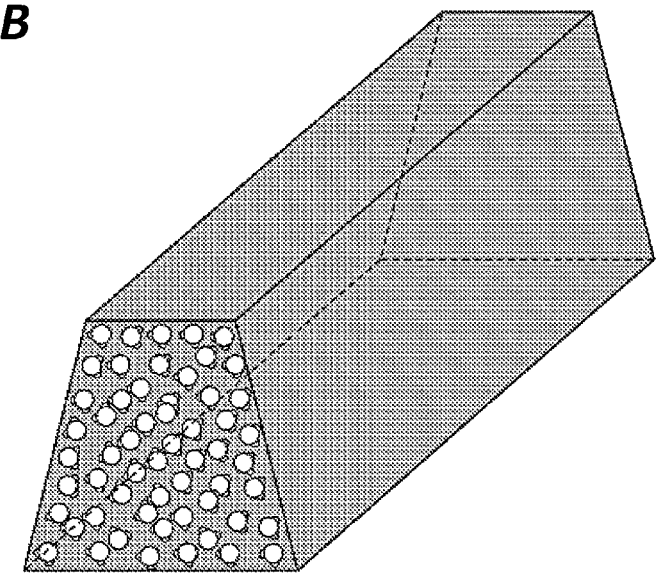
FIG. 10B is a schematic perspective view of the resist pattern formed through the forming process of the resist pattern according to the embodiment.

In the above embodiment, as compared with a case where the solidified film is exposed after the coating film is solidified by baking (pre applied bake; PAB), EUV light is likely to act uniformly on the semi-solidified film R2. In other words, the polymers that constitute the solidified film are relatively strongly bonded to each other, and thus, it is difficult for EUV light to reach the deep portion of the solidified film (the portion of the solidified film in the vicinity of the surface of the substrate). As a result, since the portion that is easily dissolved by the developer and the portion that is difficult to be dissolved by the developer tend to unevenly present in the resist film, the LWR is likely to be large (see FIG. 10A). However, such strong bonding between the polymers substantially does not exist in the semi-solidified film R2, and thus, EUV light easily reaches the deep portion of the semi-solidified film R2. As a result, since the solubility of the resist film (solidified film R3) with respect to the developer tends to be uniform, the LWR is likely to be small (see FIG. 10B). Further, in the above embodiment, since a heating source for heating the coating film R1 is not necessary, simplification of the substrate processing system 1 and energy saving may be promoted. Further, in the above embodiment, since the resist film (solidified film R3) is likely to be melted uniformly with respect to the developer, the desired line width is implemented even when the dose amount during the exposure is small. That is, since the exposure time by the exposure device 3 is shortened, energy saving during the exposure is promoted and the processing amount (throughput) of the wafer W is improved. From the above, according to the embodiment, it is possible to achieve both further improvement of the LWR and improvement of productivity.

In the above embodiment, the semi-solidified film R2 after the exposure and before the development is heated (PEB) in the unit U2 of the processing module 17. As a result, the acid generated in the semi-solidified film R2 due to the exposure is likely to be diffused into the resist film (solidified film R3) by heating. As a result, in the subsequent developing processing, the solubility of the resist film (solidified film R3) with respect to the developer is likely to be more uniform. Therefore, it is possible to promote further improvement of the LWR.

In the above embodiment, when the coating film R1 is formed, the resist liquid and the polar solvent are supplied to the surface Wa of the wafer W. As a result, during the development, the polar solvent is contained in the resist film (solidified film R3). Therefore, the polar solvent contained in the resist film (solidified film R3) serves as a clue for attracting the polar solvent contained in the developer to the resist film together with a developer. As a result, since the development of the resist film is further promoted, it is possible to promote further improvement of the LWR.

In the above embodiment, in order to contain the polar solvent in the resist film, the polar solvent and the resist liquid are supplied to the surface Wa of the wafer W, respectively. In this case, since the polar solvent and the resist liquid are likely to be mixed together, the polar solvent tends to be uniformly contained in the resist film. As a result, in the subsequent developing processing, the solubility of the resist film (solidified film R3) with respect to the developer is likely to be more uniform. Therefore, it is possible to promote further improvement of the LWR.

In the above embodiment, the dipole moment of the polar solvent may be approximately 1.5 debyes to 3.5 debyes. In this case, it is possible to further increase the improvement rate of the LWR.

In the above embodiment, the film thickness of the coating film R1 may be 50 nm or less. In this case, since the solvent contained in the coating film R1 is more likely to be volatilized without heating, the coating film R1 may easily become the semi-solidified film R2.

In the embodiment, a part or all of the solvent contained in the coating film R1 is volatilized by rotating the wafer W. As a result, it is possible to volatilize the solvent contained in the coating film R1 by a very simple method.

[Modification]

It should be considered that the embodiments disclosed in here are exemplary and not restrictive in all aspects. The above-described embodiments may be omitted, replaced, or changed in various forms without departing from the scope of attaching claims and the gist thereof.

(1) The apparatus and the method according to the present disclosure is not limited to the resist for EUV, but may be applied to other resists (e.g., resist for ArF, resist for immersion ArF).

(2) In order to apply the resist liquid to the surface Wa of the wafer W, it is possible to adopt not only the spin coating method as in the above embodiment, but also a spinless coating method.

(3) The resist film may not contain the polar solvent. That is, the polar solvent may not be supplied or added.

Figure 11:
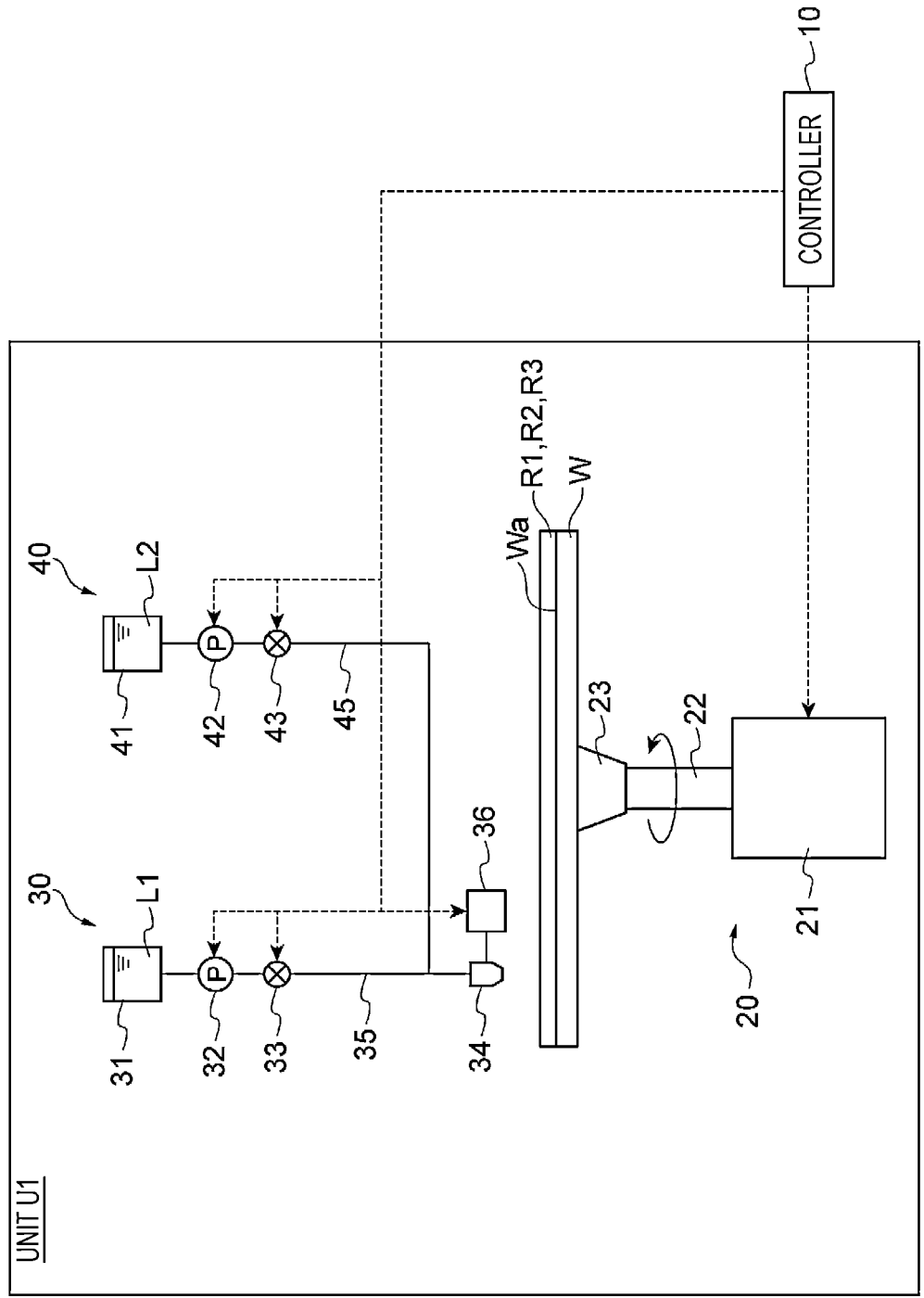
FIG. 11 is a schematic view illustrating another example of a liquid processing unit.

(4) As illustrated in FIG. 11, in the unit U1 of the processing module 16, the liquid supply 40 may not include the nozzle 44 and the driving mechanism 46. In this case, the pipe 45 is connected to the pipe 35 between the valve 33 and the nozzle 34. As a result, in the example in FIG. 11, the mixed liquid obtained by mixing the resist liquid from the liquid source 31 and the polar solvent from the liquid source 41 in the pipe 35 is discharged from the nozzle 34.

Figure 12:
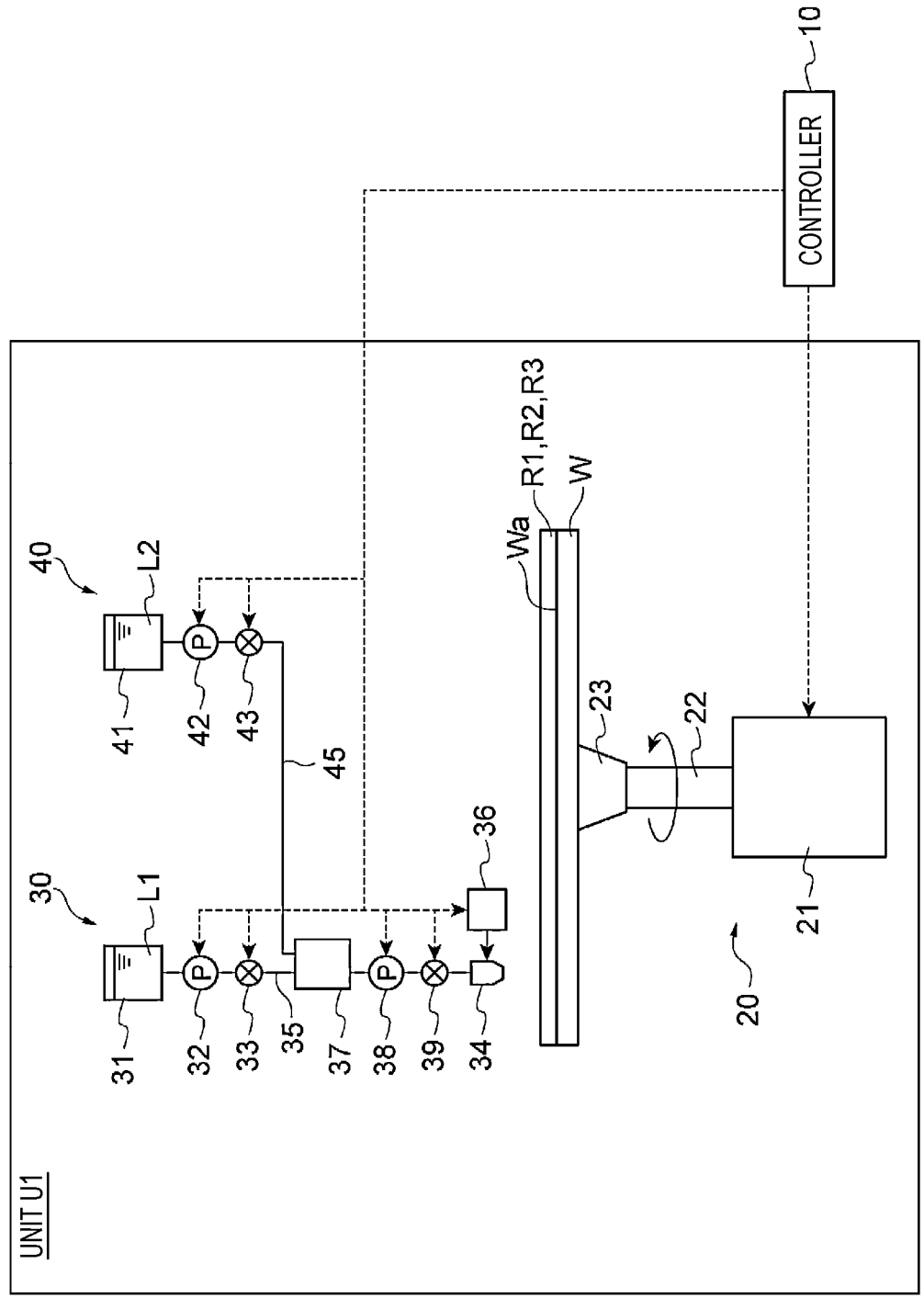
FIG. 12 is a schematic view illustrating another example of a liquid processing unit.
Figure 13A:
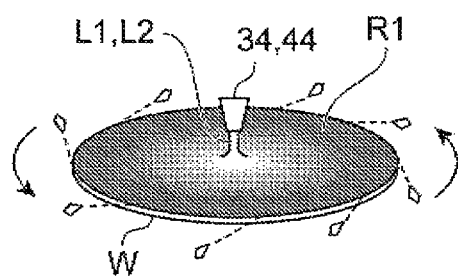
FIGS. 13A to 13F are schematic views for explaining another example of a forming process of a resist pattern.
Figure 13B:
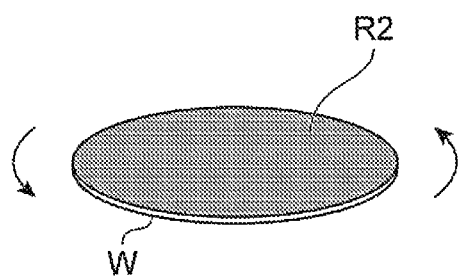
Figure 13C:
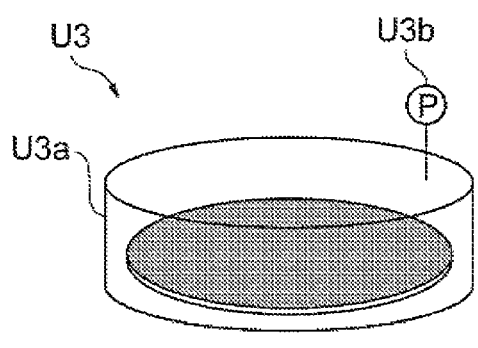
Figure 13D:
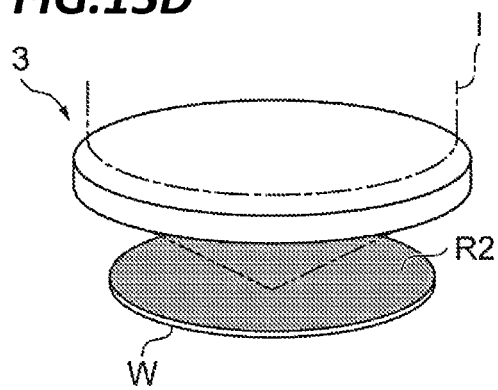
Figure 13E:
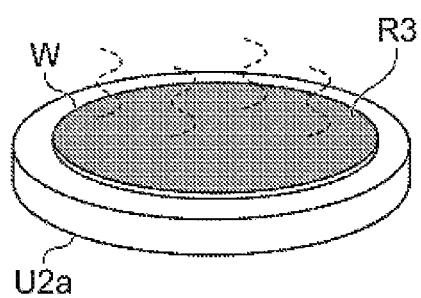
Figure 13F:
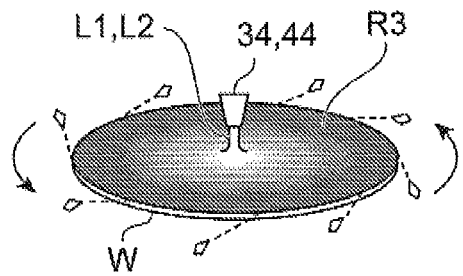
Figure 14A:
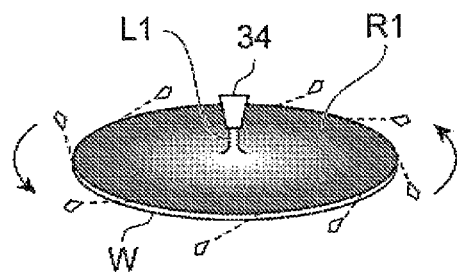
FIGS. 14A to 14F are schematic views for explaining another example of a forming process of a resist pattern.
Figure 14B:
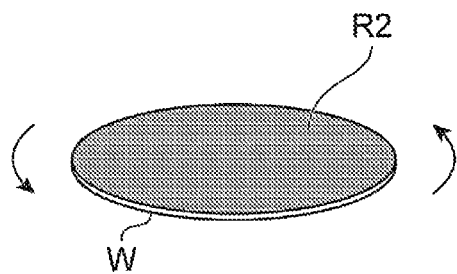
Figure 14C:
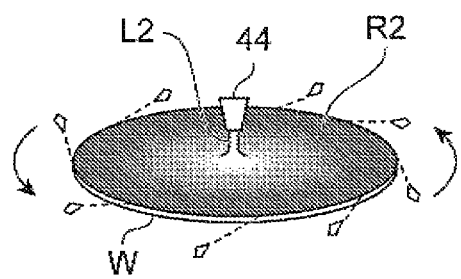
Figure 14D:
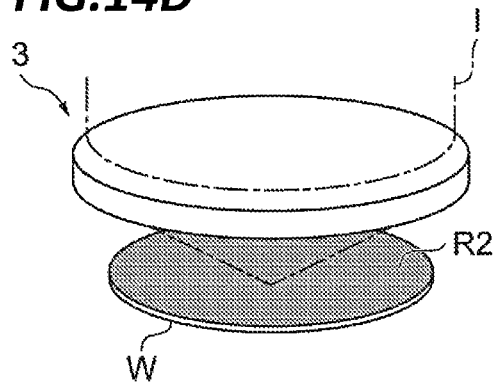
Figure 14E:
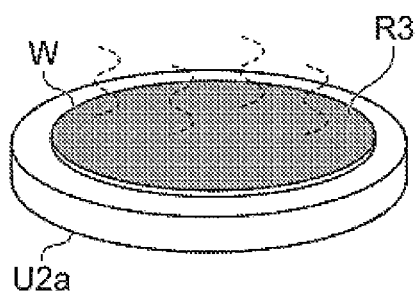
Figure 14F:
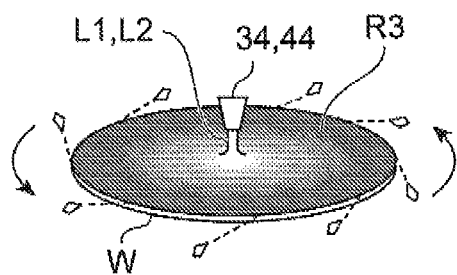

(5) As illustrated in FIG. 12, the unit U1 of the processing module 16 may not include the nozzle 44 and the driving mechanism 46 in the liquid supply 40, but may additionally include a mixing tank 37, a pump 38, and a valve 39. In this case, the pipe 35 sequentially connects the liquid source 31, the pump 32, the valve 33, the mixing tank 37, the pump 38, the valve 39, and the nozzle 34 from the upstream side. A downstream end of the pipe 45 is connected to the mixing tank 37. As a result, in the example in FIG. 12, the resist liquid from the liquid source 31 and the polar solvent from the liquid source 41 are once mixed in the mixing tank 37. The mixed liquid in the mixing tank 37 is discharged from the nozzle 34 according to the control of the pump 38 and the valve 39 by the controller 10.

(6) As illustrated in FIGS. 13A to 13F, the substrate processing system 1 may additionally include a pressure unit U3 (pressurizing unit or depressurizing unit). The pressure unit U3 includes a pressure chamber U3a (chamber) and a pump U3b, and is configured to pressurize or depressurize the pressure in the pressure chamber U3a by the pump U3b. In this case, after the coating film R1 is formed (see FIG. 13A) on the surface Wa of the wafer W and the semi-solidified film R2 is formed (see FIG. 13B) on the surface Wa of the wafer W, the controller 10 controls each part of the substrate processing system 1 to transfer the wafer W into the pressure chamber U3a. After a predetermined time is elapsed in a state where the inside of the pressure chamber U3a becomes a predetermined pressure by the pump U3b, the wafer W may be carried out from the pressure chamber U3a. When the inside of the pressure chamber U3a is pressurized, the pressure of approximately 1 MPa to 5 MPa may be maintained for approximately 30 seconds to 120 seconds. When the inside of the pressure chamber U3a is depressurized, the pressure of approximately 5 mTorr to 20 mTorr may be maintained for approximately 5 seconds to 900 seconds. After that, as in the above embodiment, the exposure (see FIG. 13D), the heating (see FIG. 13E), and the development (see FIG. 13F) may be sequentially performed.

The pressurizing or the depressurizing in Modification 6 may be performed after the coating film R1 is formed on the surface Wa of the wafer W, and before the exposure. When the inside of the pressure chamber U3a in which the coating film R1 or the semi-solidified film R2 is accommodated is pressurized, the fluidity of the coating film R1 or the semi-solidified film R2 is reduced due to the pressurizing. As a result, the development of the resist film (solidified film R3) is promoted, and thus, the resist pattern is less likely to collapse even when the line width is finer. Meanwhile, when the inside of the pressure chamber U3a in which the coating film R1 or the semi-solidified film R2 is accommodated is depressurized, the unnecessary component contained in the coating film R1 or the semi-solidified film R2 are likely to flow out due to the depressurizing. As a result, it is possible to promote the improvement of the quality of the resist pattern. When the inside of the pressure chamber U3a in which the coating film R1 is accommodated is depressurized, due to the depressurizing, the solvent contained in the coating film R1 is likely to be volatilized. As a result, except for the rotation of the wafer W, the solvent contained in the coating film R1 may be volatilized (depressurizing drying) without heating by depressurizing the atmosphere of the coating film R1 by the pressure unit U3.

(7) In the above embodiment, although the polar solvent is supplied to the wafer W together with the resist liquid to mix the polar solvent and the resist liquid, the supply or adding timing of the polar solvent is not limited thereto. For example, as illustrated in FIGS. 14A to 14F, after the coating film R1 is formed by supplying the resist liquid to the surface Wa of the wafer W (see FIG. 14A) and the coating film R1 becomes the semi-solidified film R2 (see FIG. 14B), the polar solvent may be supplied to the semi-solidified film R2 (see FIG. 14C). After that, as in the above embodiment, the exposure (see FIG. 14D), the heating (see FIG. 14E), and the development (see FIG. 14F) may be sequentially performed.

Figure 15A:
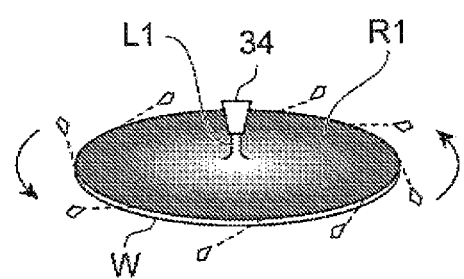
FIGS. 15A to 15F are schematic views for explaining another example of a forming process of a resist pattern.
Figure 15B:
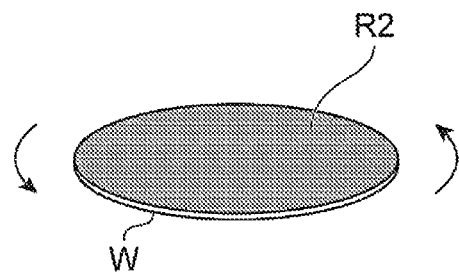
Figure 15C:
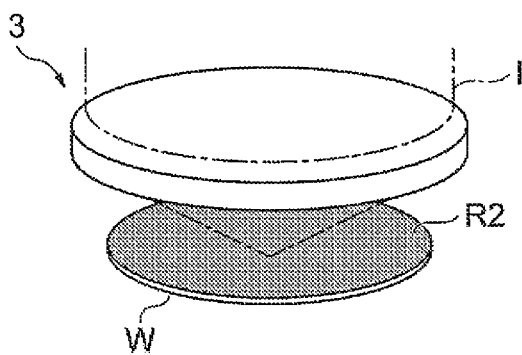
Figure 15D:
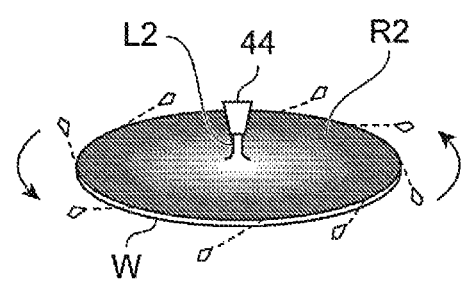
Figure 15E:
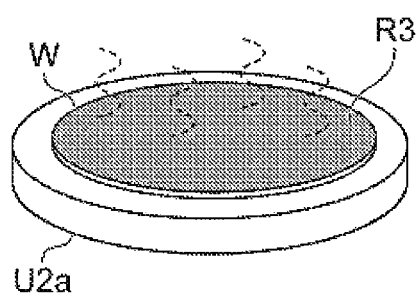
Figure 15F:
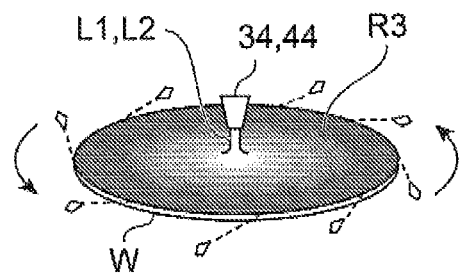

As illustrated in FIGS. 15A to 15F, after the formation of the coating film R1 (see FIG. 15A), the formation of the semi-solidified film R2 (see FIG. 15B), and the exposure (see FIG. 15C), the polar solvent may be supplied to the semi-solidified film R2 (see FIG. 15D). After that, as in the above embodiment, the heating (see FIG. 15E), and the development (see FIG. 15F) may be sequentially performed.

Figure 16A:
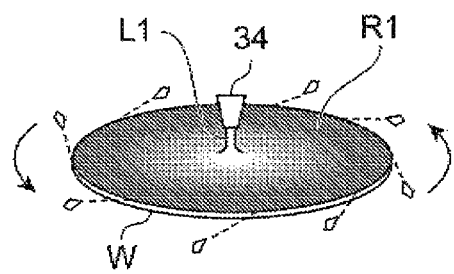
FIGS. 16A to 16F are schematic views for explaining another example of a forming process of a resist pattern.
Figure 16B:
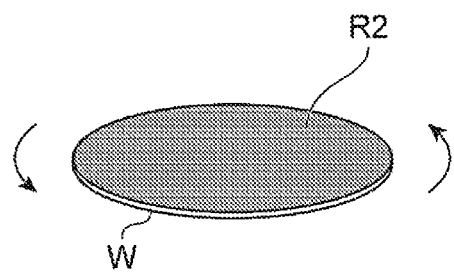
Figure 16C:
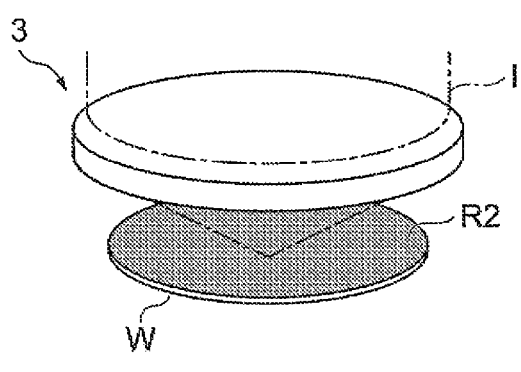
Figure 16D:
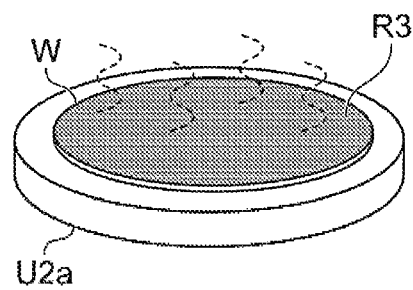
Figure 16E:
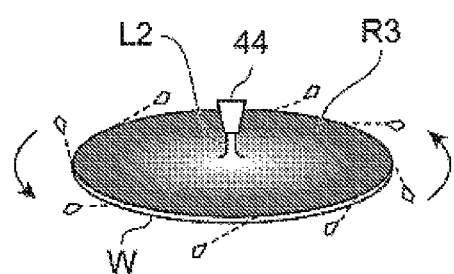
Figure 16F:
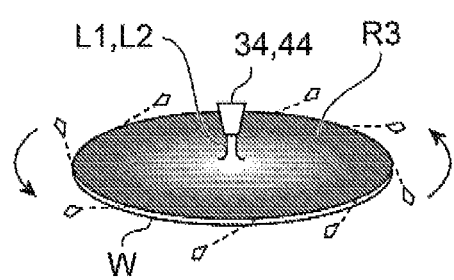

As illustrated in FIGS. 16A to 16F, after the formation of the coating film R1 (see FIG. 16A), the formation of the semi-solidified film R2 (see FIG. 16B), the exposure (see FIG. 16C), and the heating (see FIG. 16D), the polar solvent may be supplied to the semi-solidified film R2 (see FIG. 16E). After that, as in the above embodiment, the development (see FIG. 16F) may be performed.

(8) The polar solvent may be supplied to the coating film R1 or the semi-solidified film R2 in a liquid phase, in a mist phase, or a vapor phase.

(9) In the above embodiment, after the exposure, the semi-solidified film R2 is heated in the unit U2 of the processing module 17, but the heating of the semi-solidified film R2 may not be performed.

(10) The semi-solidified film R2 may be provided with a film on its outer surface. In other words, the semi-solidified film R2 may include a base portion and a film. The base portion is positioned inside the film. The film covers the outer surface of the base portion (e.g., surface excluding the surface where the base portion is in contact with the wafer W). The thickness of the film may be, for example, 1 nm or less, 0.5 nm or less, or 0.1 nm or less.

The film is formed by volatilizing the solvent from the outer surface portion of the coating film R1 in the procedure in which the coating film R1 becomes the semi-solidified film R2. As a result, the solvent content of the film is smaller than the solvent content of the base portion. In other words, the film is less fluid than the base portion. Further, the polymer density (polymer mass per unit volume) of the film is higher than the polymer density of the base portion.

In this case, since a predetermined film is provided on, in particular, the outer surface of the semi-solidified film R2, and the solvent is not volatilized inside the semi-solidified film, the state in which EUV light easily reaches the deep portion of the semi-solidified film is maintained. As a result, since the solubility of the resist film (solidified film R3) with respect to the developer tends to be uniform, the LWR is likely to be small. Therefore, it is possible to promote further improvement of the LWR. Further, since a predetermined film is provided on the outer surface of the semi-solidified film R2, it is extremely difficult for the solvent to be volatilized from the inside (base portion) of the semi-solidified film R2. As a result, even when the time taken from the formation of the semi-solidified film R2 to the exposure is different for each wafer W, unevenness of the film quality of the semi-solidified film R2 hardly occurs. Therefore, since the variation of the line width between different substrates is suppressed, it is possible to improve the uniformity of the line width between different substrates.

The method for forming the film on the outer surface of the base portion may be sometimes referred to as skinning. Examples of the skinning may include accommodating the wafer W including the coating film R1 into the chamber with the inside depressurized. In this case, due to the depressurizing, the solvent is likely to be volatilized particularly from the outer surface of the coating film R1. As a result, the semi-solidified film R2 provided with the film on the outer surface may be efficiently formed. The chamber may be the pressure chamber U3a described above (see FIG. 13C) or be a chamber that constitutes the exposure device 3. The pressure in the chamber may be, for example, 200 mTorr or less, 100 mTorr or less, 50 mTorr or less, 10 mTorr or less, or 5 mTorr or less. The processing time of the wafer W in the chamber may be, for example, 90 seconds or more, 120 seconds or more, 300 seconds or more, or 900 seconds or more.

Another example of the skinning may include flowing a gas on the outer surface of the coating film R1. In this case, due to the gas flowing on the outer surface of the coating film R1, the solvent is likely to be volatilized particularly from the outer surface of the coating film R1. As a result, the semi-solidified film R2 provided with the film on the outer surface may be efficiently formed. The gas may be an inert gas (e.g., nitrogen). The gas may flow on the outer surface of the coating film R1 by spraying the gas toward the coating film R1. The gas may flow on the outer surface of the coating film R1 by sucking the gas around the coating film R1. The flow velocity of the gas in the vicinity of the coating film R1 may be 4 l/min or more.

Yet another example of the skinning may include adjusting at least one of atmosphere temperature and the temperature of the wafer W so that the atmosphere temperature on the outer surface side of the coating film R1 is higher than the temperature of the wafer W including the coating film R1. In this case, since the temperature of the outer surface of the coating film R1 is relatively high, the solvent is likely to be volatilized from the outer surface of the coating film R1. As a result, the semi-solidified film R2 provided with the film on the outer surface may be efficiently formed.

The outer surface side of the coating film R1 may be heated to adjust so that the atmosphere temperature is relatively high. A heating source such as a heater may be provided on the outer surface side of the coating film R1, or the heated gas may be supplied to the coating film R1. The temperature of the heating source or the heated gas may be, for example, approximately 60° C. to 110° C. In this case, the solvent is promoted to be volatilized from the outer surface of the coating film R1. As a result, the semi-solidified film R2 provided with the film on the outer surface may be further efficiently formed.

The temperature of the wafer W (temperature of the portion where the coating film R1 is in contact with the wafer W) may be adjusted to be relatively low by cooling the wafer W. For example, a cooling module is provided in the holder 23 that holds the wafer W, and the wafer W may be cooled by the cooling module via the holder 23. The temperature of the holder 23 may be, for example, 23° C. or less, or approximately −5° C. to 23° C. In this case, the temperature of the outer surface of the coating film R1 is likely to be relatively high. As a result, the semi-solidified film R2 provided with the film on the outer surface may be further efficiently formed.

In the skinning by the depressurizing or the flowing of the gas, the outer surface side of the coating film R1 may be heated, the wafer W may be cooled, and both of them may be performed.

Example 1

Following tests are performed to confirm that the LWR is improved when a resist pattern is formed by using the substrate processing system 1 according to the embodiment described above.

(Example 1-1)

In Example 1-1, a resist pattern is formed by the following order using the substrate processing system 1 according to the above embodiment. That is, first, in the unit U1 of the processing module 16, the resist liquid for EUV is supplied to the surface Wa of the wafer W to form the coating film R1. At this time, the wafer W is rotated at a rotation speed of 1,500 rpm for two seconds. Subsequently, the wafer W is rotated continuously after the supply of the resist liquid is stopped, the solvent contained in the coating film R1 is volatilized without heating, and the coating film R1 becomes the semi-solidified film R2. At this time, the wafer W is rotated at a rotation speed of 1,000 rpm for two seconds. Subsequently, in the exposure device 3, the semi-solidified film R2 is exposed in a predetermined pattern. Subsequently, in the unit U2 of the processing module 17, the semi-solidified film R2 after the exposure is heated. At this time, the semi-solidified film R2 is heated at a heating temperature of 90° C. for 60 seconds. Subsequently, in the unit U1 of the processing module 17, the solidified film R3 (resist film) is developed to form a resist pattern having a line width of approximately 180 nm on the surface Wa of the wafer W. In the above procedure, the polar solvent is not added or supplied.

(Example 1-2)

In Example 1-2, the procedure is the same as that of Example 1-1 except that, in the unit U1 of the processing module 16, water is supplied as the polar solvent together with the resist liquid for EUV to the surface Wa of the wafer W to form the coating film R1. The mixing ratio of the water and the resist liquid is 10 parts by weight of the water with respect to 100 parts by weight of the resist liquid.

(Comparative Example 1)

In Comparative Example 1, the procedure is the same as that of Example 1-1 except that the coating film R1 becomes the solidified film by baking (PAB), instead of volatilizing the solvent contained in the coating film R1 without heating by rotating the wafer W. At this time, the coating film R1 is heated at a heating temperature of 130° C. for 60 seconds.

(Result 1-1)

With respect to each of Example 1-1, Example 1-2, and Comparative Example 1, enlarged image data of the resist pattern is acquired using an electron microscope, and the line width [nm] of the resist pattern is measured based on the image data at thousands points. After that, the LWR is calculated based on the obtained line width.

The LWR is a value representing unevenness of the line width of the resist pattern, and here, a value ($3\sigma$) three times the standard deviation is used for the evaluation.

Figure 17A:
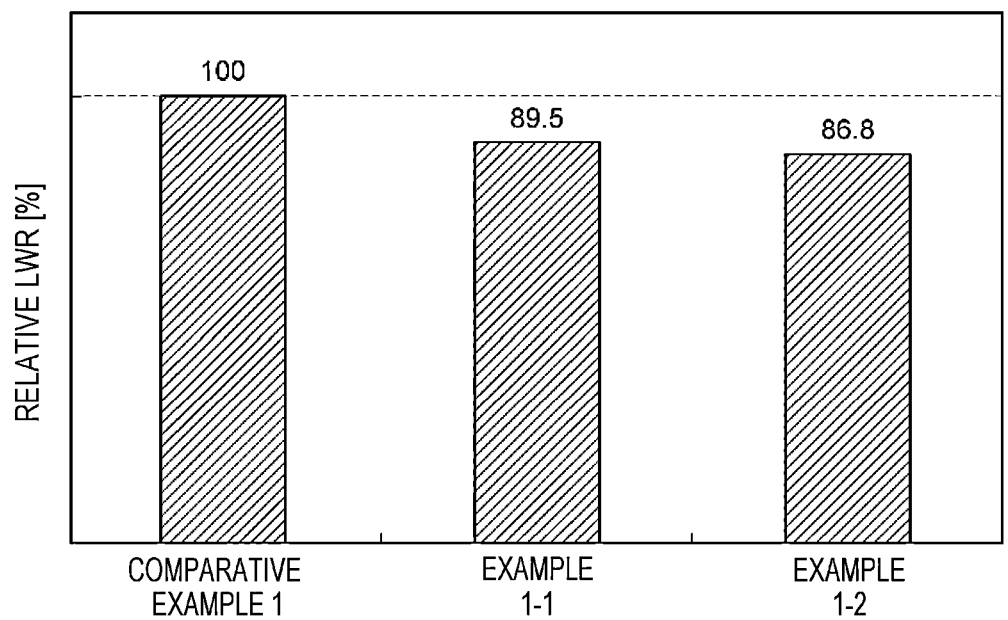
FIG. 17A is a graph illustrating a relative LWR of Example 1-1, Example 1-2, and Comparative Example 1.

FIG. 17A illustrates a relative LWR when the LWR in Comparative Example 1 is set to 100. As illustrated in FIG. 17A, it is confirmed that, in Example 1-1, the LWR is improved by 10.5% with respect to Comparative Example 1. As illustrated in FIG. 17A, it is confirmed that, in Example 1-2, the LWR is improved by 13.2% with respect to Comparative Example 1.

Figure 18A:
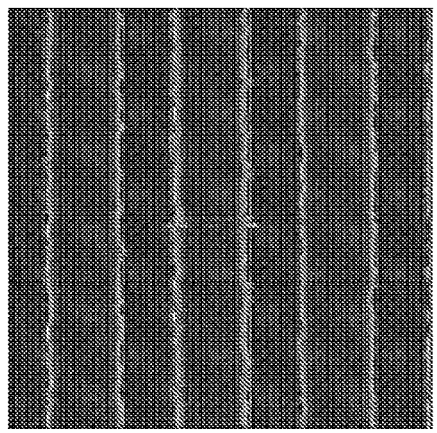
FIG. 18A is an electron micrograph of the resist pattern of Example 1-1.
Figure 18B:
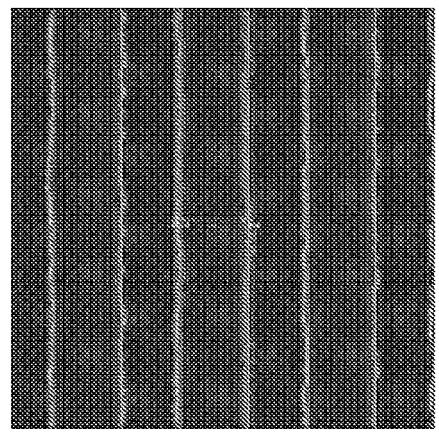
FIG. 18B is an electron micrograph of the resist pattern of Example 1-2.
Figure 18C:
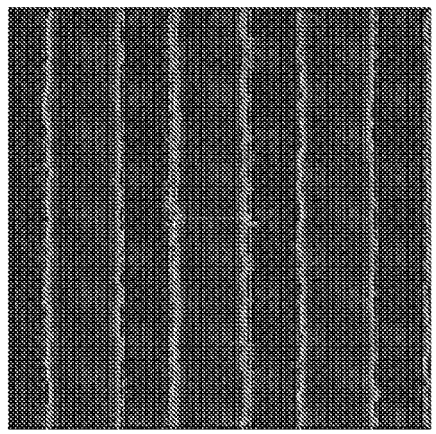
FIG. 18C is an electron micrograph of the resist pattern of Comparative Example 1.

FIGS. 18A to 18C illustrate an electron micrograph of the resist pattern of each of Example 1-1, Example 1-2, and Comparative Example 1. As is clear from the photos, it is clearly confirmed visually that the LWRs of Example 1-1 and Example 1-2 are improved with respect to Comparative Example 1.

(Result 1-2)

The dose amount (irradiation intensity [$J/m^2$] of light in the exposure device 3) is measured for each of Example 1-1, Example 1-2, and Comparative Example 1.

Figure 17B:
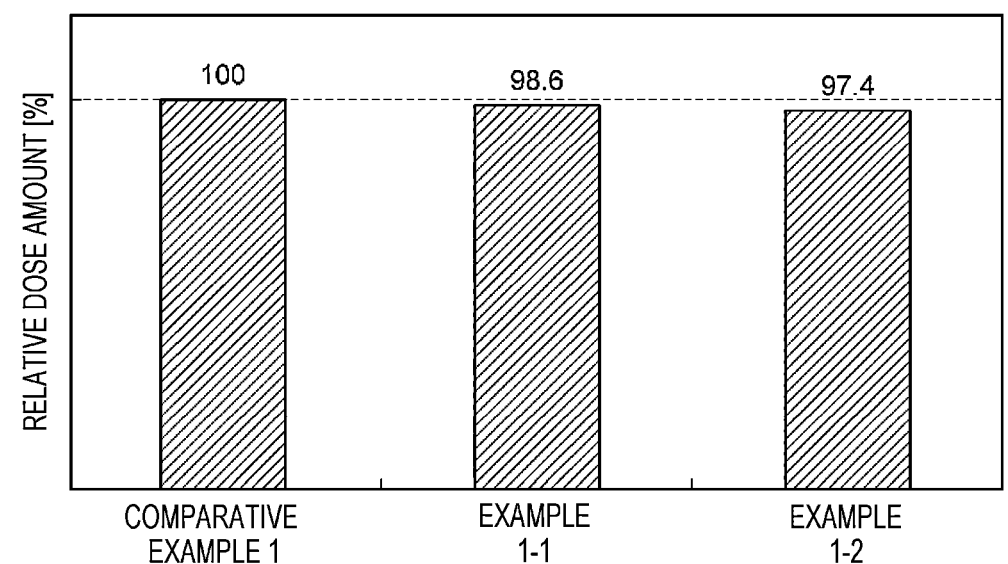
FIG. 17B is a graph illustrating a relative dose amount of Example 1-1, Example 1-2, and Comparative Example 1.

FIG. 17B illustrates a relative dose amount when the dose amount in Comparative Example 1 is set to 100. As illustrated in FIG. 17B, in Example 1-1, the dose amount is improved by 1.4% with respect to Comparative Example 1. That is, it is confirmed that, in Example 1-1, the sensitivity is improved by 1.4% with respect to Comparative Example 1. As illustrated in FIG. 17B, in Example 1-2, the dose amount is improved by 2.6% with respect to Comparative Example 1. That is, it is confirmed that, in Example 1-2, the sensitivity is improved by 2.6% with respect to Comparative Example 1.

(Result 1-3)

Figure 19:
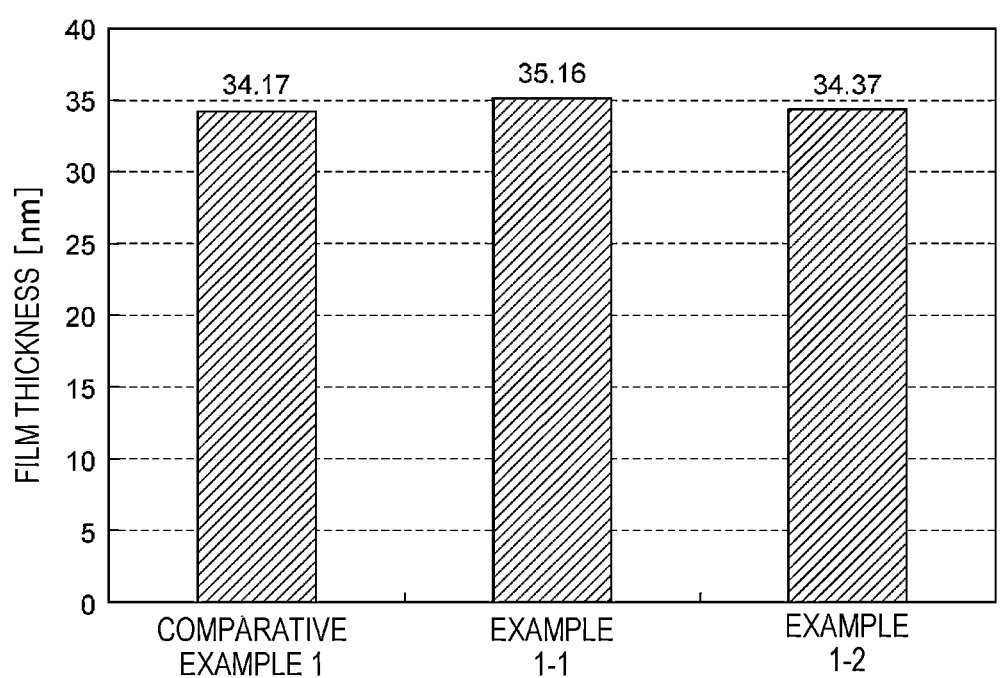
FIG. 19 is a graph illustrating a film thickness of a resist pattern of each of Example 1-1, Example 1-2, and Comparative Example 1.

FIG. 19 illustrates the film thickness of the resist pattern of each of Example 1-1, Example 1-2, and Comparative Example 1. As illustrated in FIG. 19, it is confirmed that the film thickness is decreased by volatilizing most of the solvent from the coating film through the PAB.

(Result 1-4)

Figure 20:
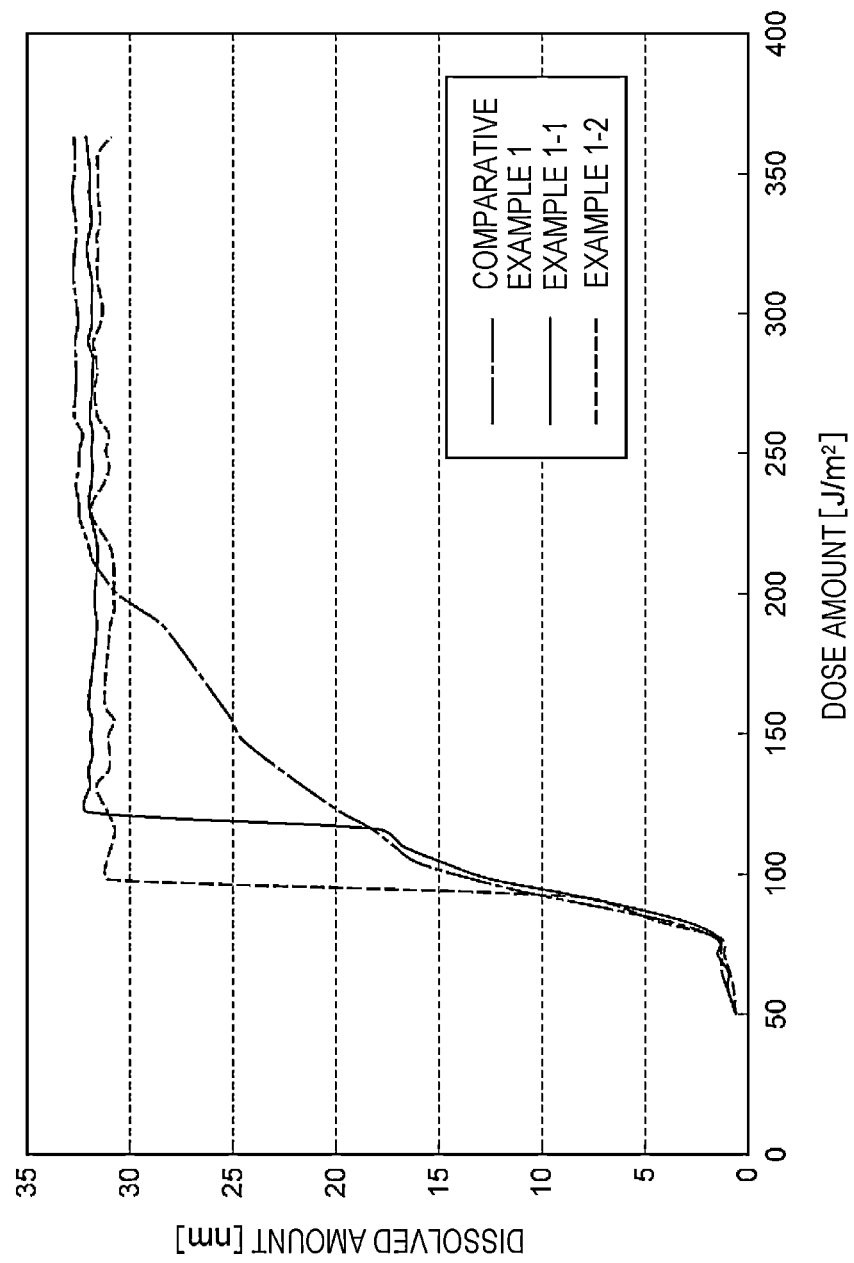
FIG. 20 is a graph illustrating a dissolved amount of the resist film relative to the dose amount of each of Example 1-1, Example 1-2, and Comparative Example 1.

FIG. 20 illustrates the dissolved amount [nm] of the resist film relative to the dose amount of each of Example 1-1, Example 1-2, and Comparative Example 1. Here, the "dissolved amount" means the amount of the resist film (decreased amount of the resist film) dissolved by development.

As illustrated in FIG. 20, it is confirmed that, in Example 1-1, the development is completed when the dose amount is approximately 120 J/m or more, in Example 1-2, the development is completed when the dose amount is approximately 100 $J/m^2$ or more, and, in Comparative Example 1, the development is completed when the dose amount is approximately 230 $J/m^2$ or more. As a result, it is confirmed that, in Example 1-1 and Example 1-2, the desired line width may be obtained even when the dose amount is smaller than that of the Comparative Example 1.

Example 2

Following tests are performed to confirm the change in the LWR depending on the timing of the supply or addition of the polar solvent, when a resist pattern is formed by using the substrate processing system 1 according to the embodiment described above.

(Example 2-1)

In Example 2-1, the procedure is the same as that of Example 1-1 except that water serving as the polar solvent is supplied to the semi-solidified film R2, after the exposure and before the heating of the semi-solidified film R2.

(Comparative Example 2-1)

In Comparative Example 2-1, the procedure is the same as that of Comparative Example 1 except that, in the unit U1 of the processing module 16, water is supplied as the polar solvent together with the resist liquid for EUV to the surface Wa of the wafer W to form the coating film R1.

(Comparative Example 2-2)

In Comparative Example 2-2, the procedure is the same as that of Comparative Example 1 except that water serving as the polar solvent is supplied to the solidified film, after the PAB and after the exposure.

(Result 2)

Similar to Result 1-1, the LWR is calculated with respect to each of Example 2-1, Comparative Example 1-2, and Comparative Example 2-2.

Figure 21:
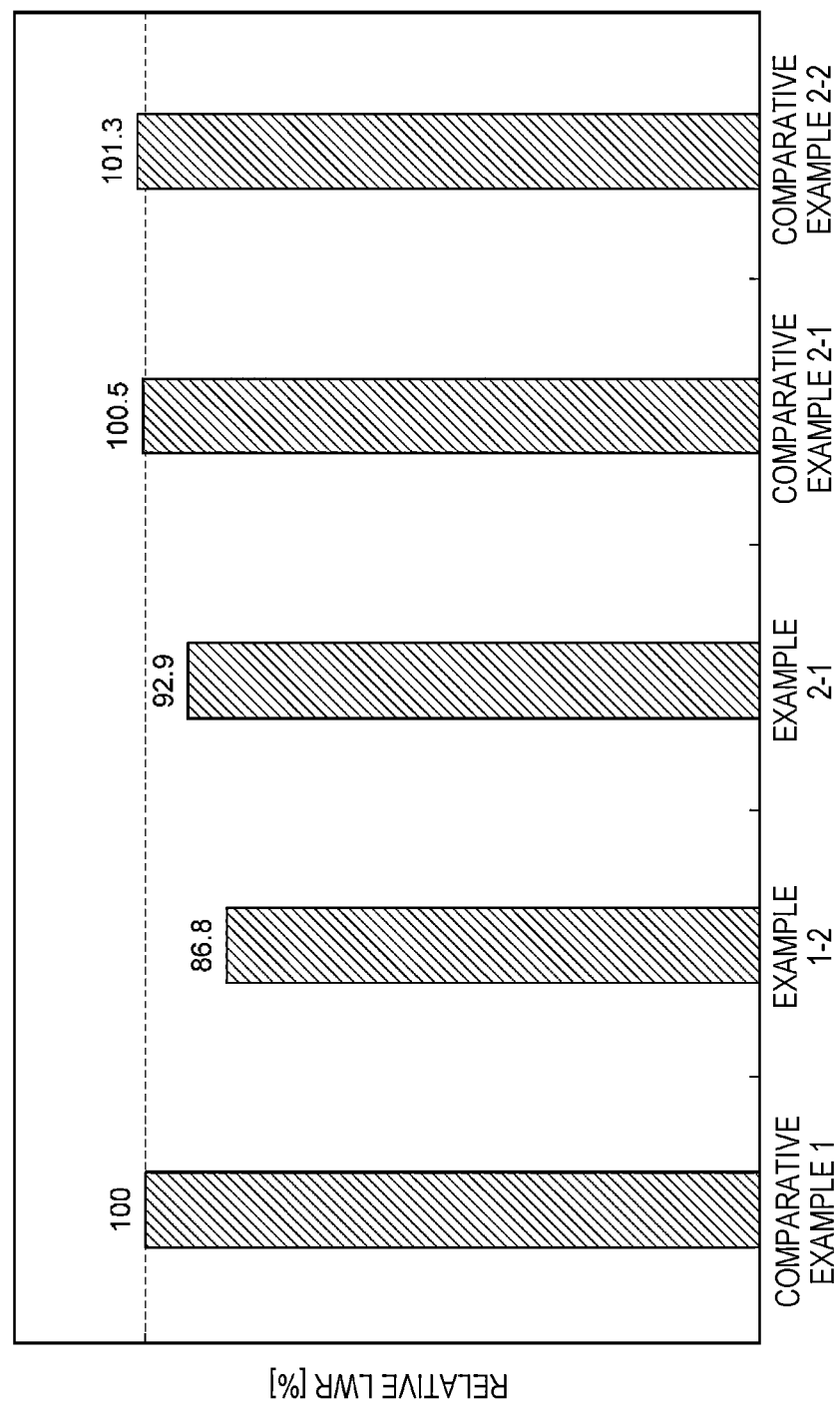
FIG. 21 is a graph illustrating a relative LWR of Example 1-2, Example 2-1, Comparative Example 1, Comparative Example 2-1, and Comparative Example 2-2.

FIG. 21 illustrates a relative LWR when the LWR in Comparative Example 1 is set to 100. As illustrated in FIG. 21, it is confirmed that, in Example 2-1, the LWR is improved by 7.1% with respect to Comparative Example 1. Therefore, according to Example 1-2 and Example 2-1, it is confirmed that the LWR is improved by supplying or adding the polar solvent regardless of the timing. Meanwhile, as illustrated in FIG. 21, it is confirmed that, in Comparative Example 1, Comparative Example 2-1, and Comparative Example 2-2 including the PAB during the process, the LWR is substantially not changed regardless of the supply or adding timing of the polar solvent.

(Example 3)

Following tests are performed to confirm the change in the LWR depending on the mixing ratio of the polar solvent and the resist liquid, when a resist pattern is formed by using the substrate processing system 1 according to the embodiment described above.

(Example 3)

In Example 3, the procedure is the same as that of Example 1-2 except that the mixing ratio of water and the resist liquid is 20 parts by weight of the water with respect to 100 parts by weight of the resist liquid.

(Result 3-1)

Similar to Result 1-1, the LWR is calculated with respect to Example 3.

Figure 22:
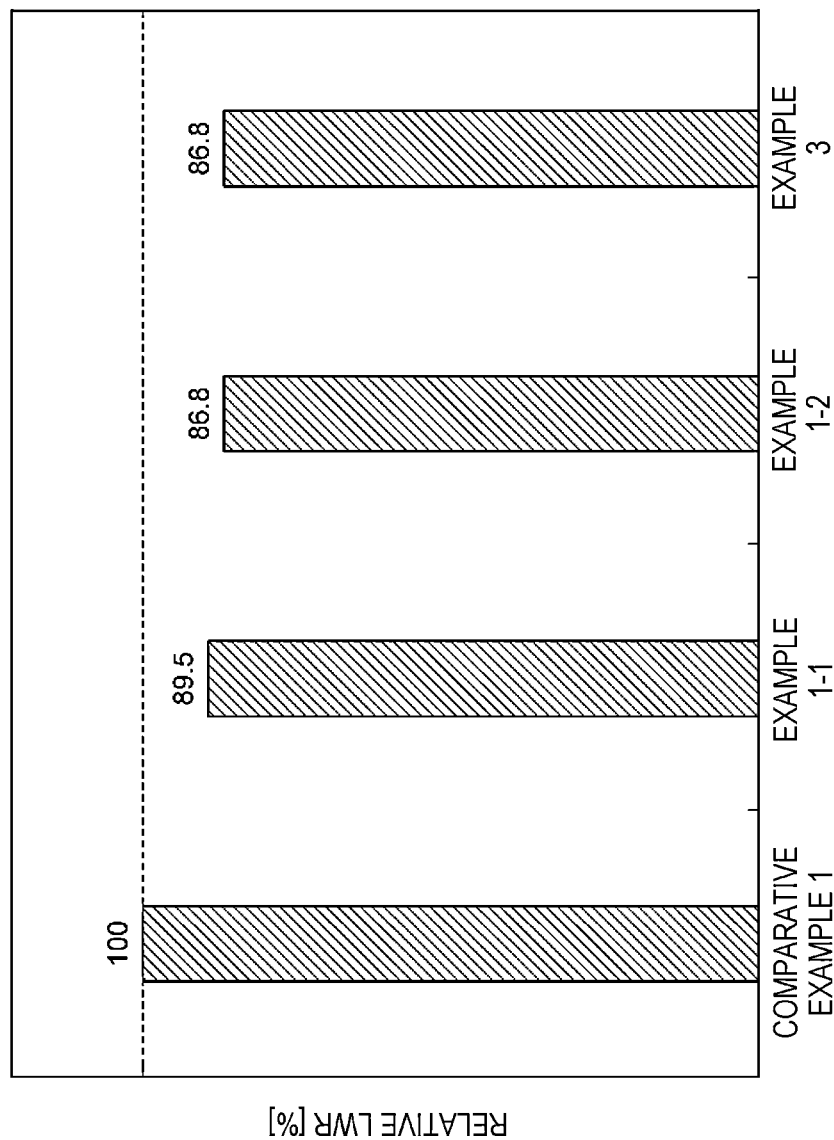
FIG. 22 is a graph illustrating a relative LWR of Example 1-1, Example 1-2, Example 3, and Comparative Example 1.

FIG. 22 illustrates a relative LWR when the LWR in Comparative Example 1 is set to 100. As illustrated in FIG. 22, it is confirmed that, in Example 3, the LWR is improved by 13.2% with respect to Comparative Example 1. As a result, according to Example 1-1, Example 1-2, and Example 3, it is confirmed that the LWR is improved.

(Result 3-2)

Figure 23:
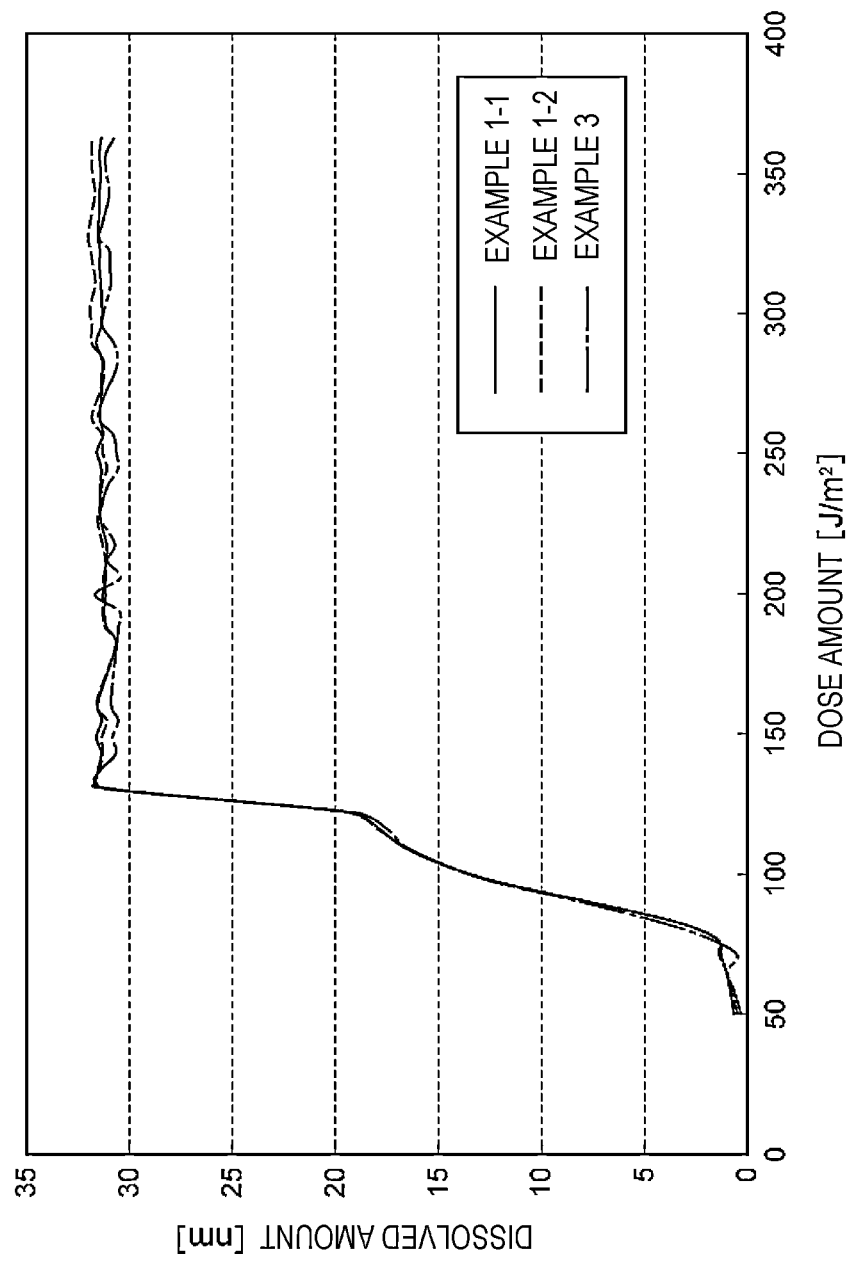
FIG. 23 is a graph illustrating a dissolved amount of the resist film relative to the dose amount of each of Example 1-1, Example 1-2, and Example 3.

FIG. 23 illustrates the dissolved amount [nm] of the resist film relative to the dose amount of each of Example 1-1, Example 1-2, and Example 3. As illustrated in FIG. 23, according to Example 1-1, Example 1-2, and Example 3, it is confirmed that the development is completed when the dose amount is approximately 120 J/m$^2$ or more regardless of the mixing ratio of the polar solvent with respect to the resist liquid.

(Example 4)

Following tests are performed to confirm the change in the LWR depending on the type of the polar solvent, when a resist pattern is formed by using the substrate processing system 1 according to the embodiment described above.

(Example 4-1)

In Example 4-1, the procedure is the same as that of Example 1-2 except that isopropyl alcohol (dipole moment of 1.68 debyes) is used as the polar solvent instead of water.

(Example 4-2)

In Example 4-2, the procedure is the same as that of Example 1-2 except that 2-heptanone (dipole moment of 2.59 debyes) is used as the polar solvent instead of water.

(Example 4-3)

In Example 4-3, the procedure is the same as that of Example 1-2 except that n-butyl alcohol (dipole moment of 1.84 debyes) is used as the polar solvent instead of water.

(Result 4-1)

Similar to Result 1-1, the LWR is calculated with respect to each of Example 4-1 to Example 4-3.

FIG. 24A illustrates a relative LWR when the LWR in Comparative Example 1 is set to 100. As illustrated in FIG. 24A, it is confirmed that, in Example 4-1, the LWR is improved by 21.9% with respect to Comparative Example 1. As illustrated in FIG. 24A, it is confirmed that, in Example 4-2, the LWR is improved by 11.7% with respect to Comparative Example 1. As illustrated in FIG. 24A, it is confirmed that, in Example 4-3, the LWR is improved by 18.3% with respect to Comparative Example 1. Therefore, according to Example 1-2 and Example 4-1 to Example 4-3, it is confirmed that the LWR is improved by various polar solvents.

(Result 4-2)

Similar to Result 1-2, the dose amount is measured with respect to each of Example 4-1 to Example 4-3.

FIG. 24B illustrates a relative dose amount when the dose amount in Comparative Example 1 is set to 100. As illustrated in FIG. 24B, in Example 4-1, the dose amount is improved by 0.1% with respect to Comparative Example 1. That is, it is confirmed that, in Example 4-1, the sensitivity is improved by 0.1% with respect to Comparative Example 1. As illustrated in FIG. 24B, in Example 4-2, the dose amount is improved by 4.0% with respect to Comparative Example 1. That is, it is confirmed that, in Example 4-2, the sensitivity is improved by 4.0% with respect to Comparative Example 1. As illustrated in FIG. 24B, in Example 4-3, the dose amount is improved by 3.2% with respect to Comparative Example 1. That is, it is confirmed that, in Example 4-3, the sensitivity is improved by 3.2% with respect to Comparative Example 1. Therefore, according to Example 1-2 and Example 4-1 to Example 4-3, it is confirmed that the sensitivity is improved by various polar solvents.

Example 5

As illustrated in Modification 6, following tests are performed to confirm the change in the LWR when the inside of the pressure chamber U3a is pressurized in a state where the wafer W is accommodated in the pressure chamber U3a, after the formation of the coating film R1 on the surface Wa of the wafer W and before the exposure.

(Example 5-1)

In Example 5-1, the procedure is the same as that of Example 1-1 except that, after the formation of the coating film R1 on the surface Wa of the wafer W and before the exposure, the wafer W is accommodated in the pressure chamber U3a, and the inside of the pressure chamber U3a is pressurized at 5 MPa for 60 seconds.

(Example 5-2)

In Example 5-2, the procedure is the same as that of Example 1-1 except that, after the formation of the coating film R1 on the surface Wa of the wafer W and before the exposure, the wafer W is accommodated in the pressure chamber U3a, and the inside of the pressure chamber U3a is pressurized at 3 MPa for 60 seconds.

(Example 5-3)

In Example 5-3, the procedure is the same as that of Example 1-1 except that, after the formation of the coating film R1 on the surface Wa of the wafer W and before the exposure, the wafer W is accommodated in the pressure chamber U3a, and the inside of the pressure chamber U3a is pressurized at 1 MPa for 60 seconds.

(Result 5-1)

Similar to Result 1-1, the LWR is calculated with respect to each of Example 5-1 to Example 5-3.

Figure 25A:
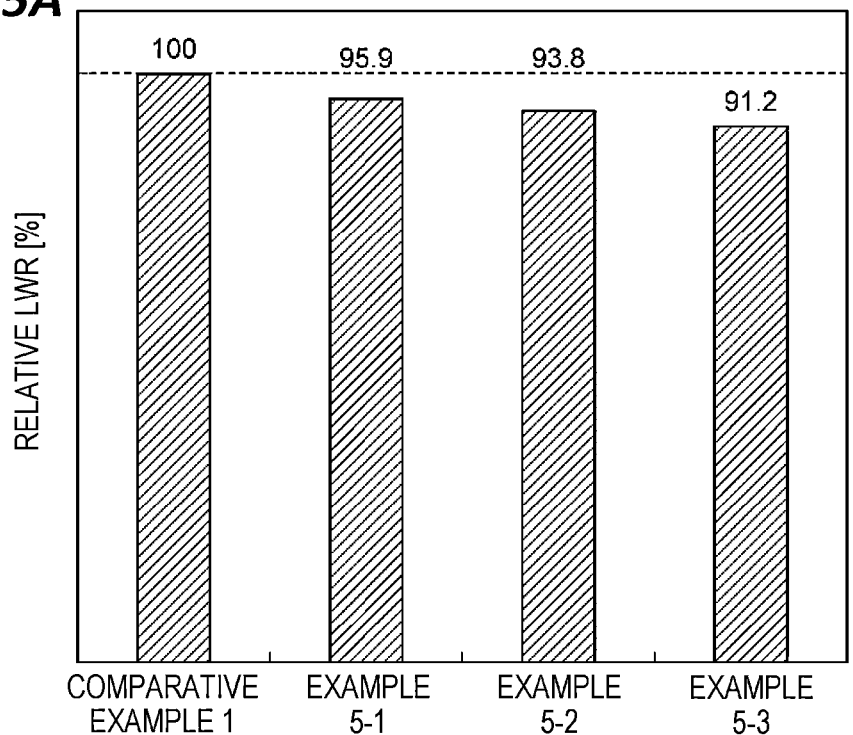
FIG. 25A is a graph illustrating a relative LWR of Example 5-1 to 5-3, and Comparative Example 1.

FIG. 25A illustrates a relative LWR when the LWR in Comparative Example 1 is set to 100. As illustrated in FIG. 25A, it is confirmed that, in Example 5-1, the LWR is improved by 4.1% with respect to Comparative Example 1. As illustrated in FIG. 25A, it is confirmed that, in Example 5-2, the LWR is improved by 6.2% with respect to Comparative Example 1. As illustrated in FIG. 25A, it is confirmed that, in Example 5-3, the LWR is improved by 8.8% with respect to Comparative Example 1. Therefore, according to Example 5-1 to Example 5-3, it is confirmed that the LWR is improved by the pressurizing.

(Result 5-2)

Similar to Result 1-2, the dose amount is measured with respect to each of Example 5-1 to Example 5-3.

Figure 25B:
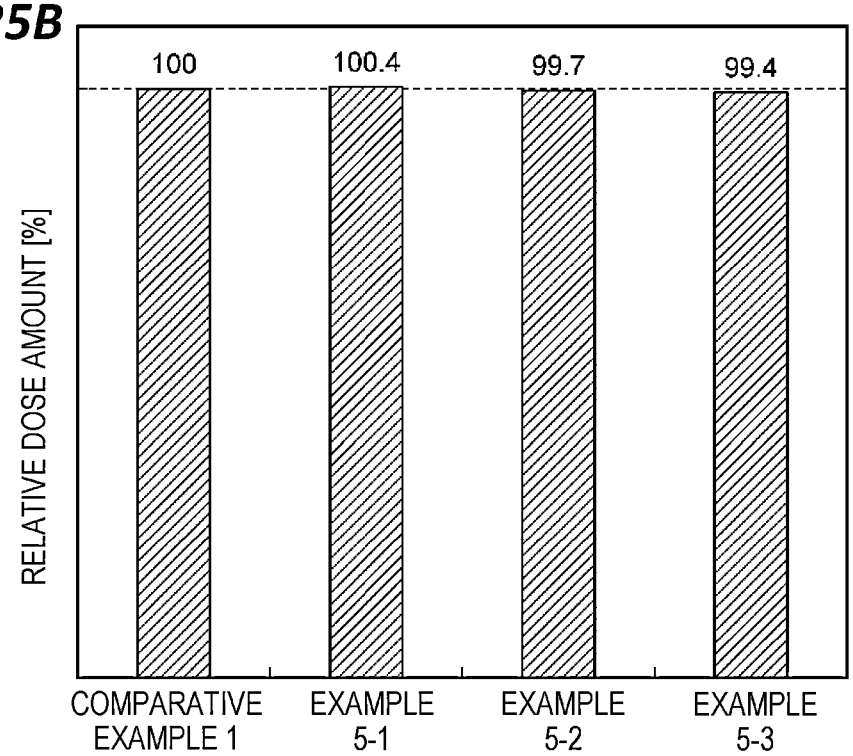
FIG. 25B is a graph illustrating a relative dose amount of Example 5-1 to 5-3, and Comparative Example 1.

FIG. 25B illustrates a relative dose amount when the dose amount in Comparative Example 1 is set to 100. As illustrated in FIG. 25B, in Example 5-1, the dose amount is impaired by 0.4% with respect to Comparative Example 1. As illustrated in FIG. 25B, in Example 5-2, the dose amount is improved by 0.3% with respect to Comparative Example 1. That is, it is confirmed that, in Example 5-2, the sensitivity is improved by 0.3% with respect to Comparative Example 1. As illustrated in FIG. 25B, in Example 5-3, the dose amount is improved by 0.6% with respect to Comparative Example 1. That is, it is confirmed that, in Example 5-3, the sensitivity is improved by 0.6% with respect to Comparative Example 1. Therefore, according to Example 5-1 to Example 5-3, it is confirmed that the sensitivity is improved by pressurizing at 3 MPa or less.

Example 6

As described in Modification 6, following tests are performed to confirm the change in the LWR when the inside of the pressure chamber U3a is depressurized in a state where the wafer W is accommodated in the pressure chamber U3a, after the formation of the coating film R1 on the surface Wa of the wafer W and before the exposure.

(Example 6-1)

In Example 6-1, the procedure is the same as that of Example 1-1 except that, after the formation of the coating film R1 on the surface Wa of the wafer W and before the exposure, the wafer W is accommodated in the pressure chamber U3a, and the inside of the pressure chamber U3a is depressurized at 10 mTorr for 900 seconds.

(Example 6-2)

In Example 6-2, the procedure is the same as that of Example 1-1 except that, after the formation of the coating film R1 on the surface Wa of the wafer W and before the exposure, the wafer W is accommodated in the pressure chamber U3a, and the inside of the pressure chamber U3a is depressurized at 10 mTorr for 120 seconds.

(Example 6-3)

In Example 6-3, the procedure is the same as that of Example 1-1 except that, after the formation of the coating film R1 on the surface Wa of the wafer W and before the exposure, the wafer W is accommodated in the pressure chamber U3a, and the inside of the pressure chamber U3a is depressurized at 100 mTorr for 900 seconds.

(Example 6-4)

In Example 6-4, the procedure is the same as that of Example 1-1 except that, after the formation of the coating film R1 on the surface Wa of the wafer W and before the exposure, the wafer W is accommodated in the pressure chamber U3a, and the inside of the pressure chamber U3a is depressurized at 100 mTorr for 120 seconds.

(Example 6-5)

In Example 6-5, the procedure is the same as that of Example 1-1 except that, after the formation of the coating film R1 on the surface Wa of the wafer W and before the exposure, the wafer W is accommodated in the pressure chamber U3a, and the inside of the pressure chamber U3a is depressurized at 200 mTorr for 900 seconds.

(Example 6-6)

In Example 6-6, the procedure is the same as that of Example 1-1 except that, after the formation of the coating film R1 on the surface Wa of the wafer W and before the exposure, the wafer W is accommodated in the pressure chamber U3a, and the inside of the pressure chamber U3a is depressurized at 200 mTorr for 120 seconds.

(Result 6-1)

Similar to Result 1-1, the LWR is calculated with respect to Example 6-1.

Figure 26A:
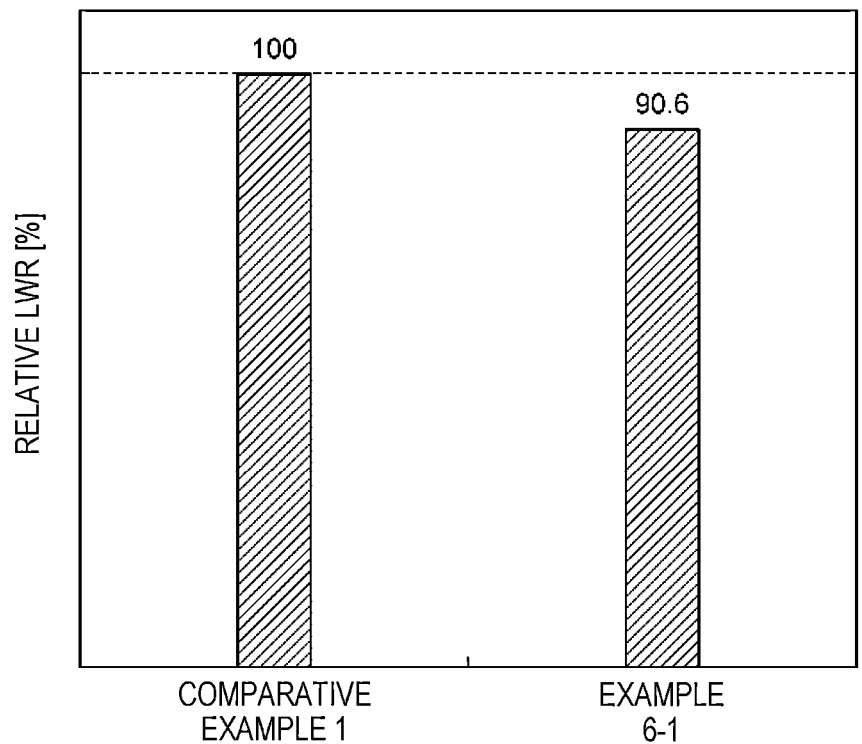
FIG. 26A is a graph illustrating a relative LWR of Example 6 and Comparative Example 1.

FIG. 26A illustrates a relative LWR when the LWR in Comparative Example 1 is set to 100. As illustrated in FIG. 26A, it is confirmed that, in Example 6-1, the LWR is improved by 9.4% with respect to Comparative Example 1. Therefore, according to Example 6-1, it is confirmed that the LWR is improved by the depressurizing.

(Result 6-2)

Similar to Result 1-2, the dose amount is measured with respect to Example 6-1.

Figure 26B:
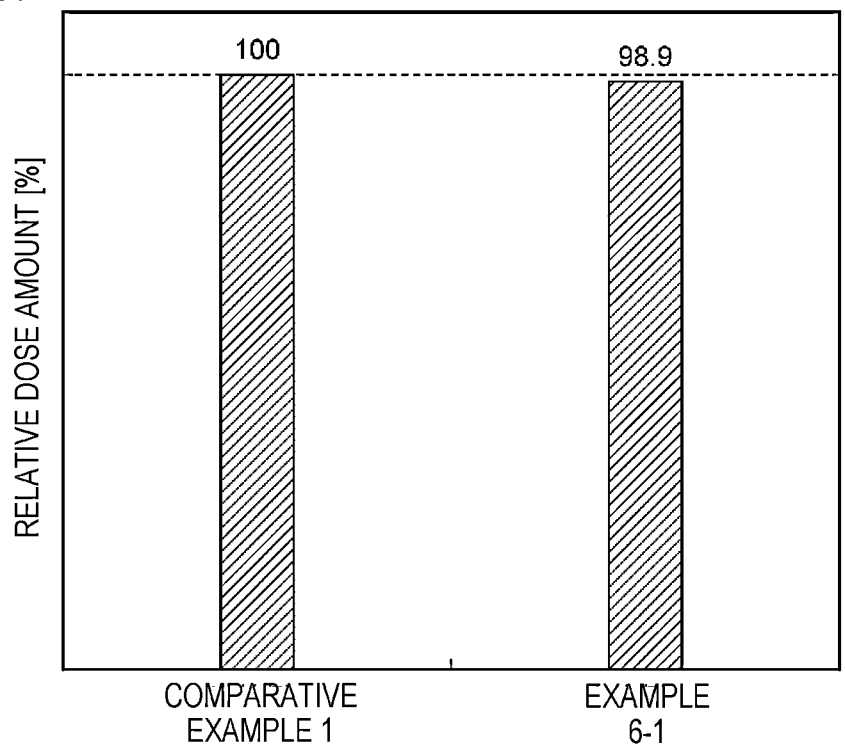
FIG. 26B is a graph illustrating a relative dose amount of Example 6 and Comparative Example 1.

FIG. 26B illustrates a relative dose amount when the dose amount in Comparative Example 1 is set to 100. As illustrated in FIG. 26B, in Example 6-1, the dose amount is improved by 1.1% with respect to Comparative Example 1. That is, it is confirmed that, in Example 6-1, the sensitivity is improved by 1.1% with respect to Comparative Example 1. Therefore, according to Example 6-1, it is confirmed that the sensitivity is improved by the depressurizing.

(Result 6-3)

Figure 27:
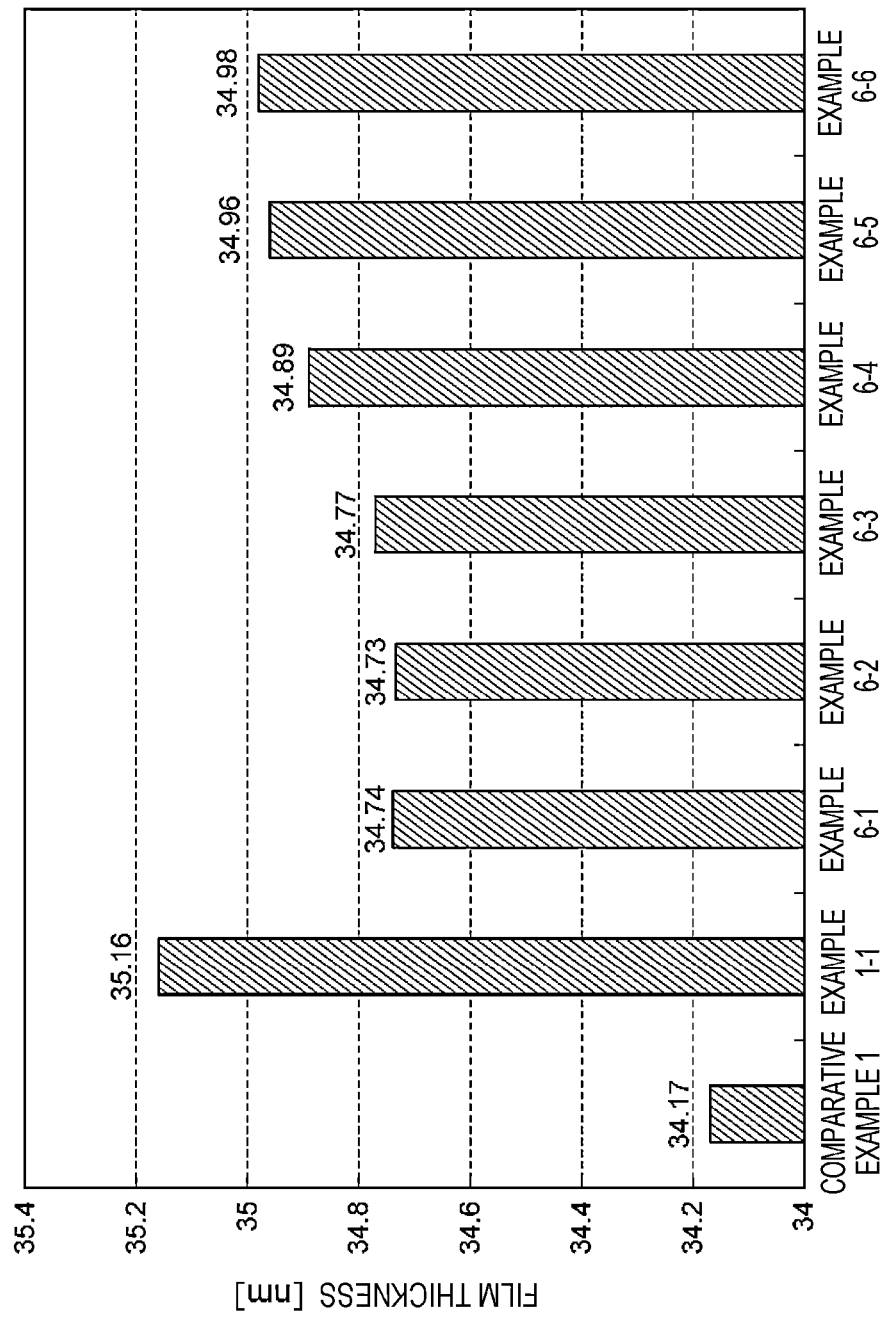
FIG. 27 is a graph illustrating a film thickness of each resist pattern of Example 1-1, Example 6-1, and Comparative Example 1.

FIG. 27 illustrates the film thickness of the resist pattern of each of Example 1, Example 6-1 to Example 6-6, and Comparative Example 1. As illustrated in FIG. 27, it is confirmed that, when the wafer W is processed in a depressurized environment, the solvent is volatilized from the outer surface of the coating film to form a film, and thus, the film thickness is decreased. Further, it is confirmed that the film thickness is decreased as the wafer W is processed at a low pressure for a long time. Further, the film thickness is substantially the same with each other in Example 6-1 and Example 6-2, and thus, it is confirmed that the film is formed in a short time as the wafer W is processed at a low pressure.

(Result 6-4)

Figure 28:
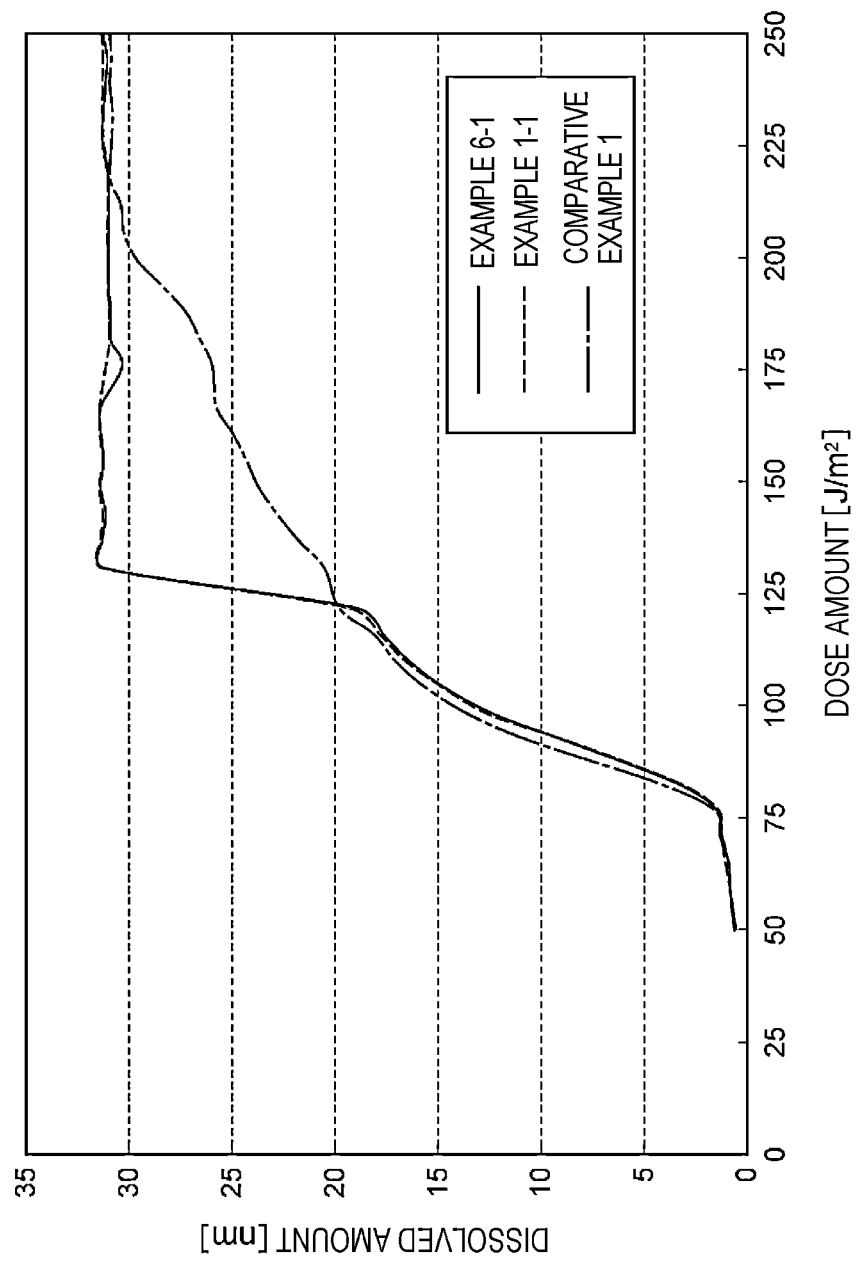
FIG. 28 is a graph illustrating a dissolved amount of the resist film relative to the dose amount in each of Example 1-1, Example 6-1, and Comparative Example 1.

FIG. 28 illustrates the dissolved amount [nm] of the resist film relative to the dose amount of each of Example 1-1, Example 6-1 to Example 6-6, and Comparative Example 1. Here, the "dissolved amount" means the amount of the resist film (decreased amount of the resist film) dissolved by development.

As illustrated in FIG. 28, it is confirmed that, in Example 1-1, the development is completed when the dose amount is approximately 120 J/m or more, in Example 1-2, the development is completed when the dose amount is approximately 100 J/m$^2$ or more, and, in Comparative Example 1, the development is completed when the dose amount is approximately 230 J/m$^2$ or more. As a result, it is confirmed that, in Example 1-1 and Example 1-2, the desired line width may be obtained even when the dose amount is smaller than that of the Comparative Example 1.

EXEMPLIFICATION

Ex. 1. A substrate processing method according to an example of the present disclosure includes forming a coating film by supplying a resist liquid photosensitive to EUV light to a surface of a substrate, forming a semi-solidified film by volatilizing a solvent contained in the coating film without heating, exposing the semi-solidified film by irradiating the semi-solidified film with EUV light, and supplying a developer to the substrate after the exposure of the semi-solidified film. In this case, as compared with a case where the solidified film after the coating film is solidified by baking (so-called PAB) is exposed, EUV light is likely to act uniformly on the semi-solidified film. In other words, the polymers that constitute the solidified film are relatively strongly bonded to each other, and thus, it is difficult for EUV light to reach the deep portion of the solidified film (the portion of the solidified film in the vicinity of the surface of the substrate). As a result, since the portion that is easily dissolved by the developer and the portion that is difficult to be dissolved by the developer tend to unevenly present in the resist film, the LWR is likely to be large. However, such strong bonding between the polymers substantially does not exist in the semi-solidified film, and thus, EUV light easily reaches the deep portion of the semi-solidified film. As a result, since the solubility of the resist film with respect to the developer tends to be uniform, the LWR is likely to be small. Further, according to Ex. 1, since a heating source for heating the coating film is not necessary, simplification of the apparatus and energy saving are promoted. Further, according to Ex. 1, since the resist film is likely to be melted uniformly with respect to the developer, the desired line width is implemented even when the dose amount during the exposure is small. That is, since the exposure time by the exposure device is shortened, energy saving during the exposure is promoted and the processing amount (throughput) of the substrate is improved. From the above, according to Ex. 1, it is possible to achieve both further improvement of the LWR and improvement of productivity.

Ex. 2. The method in Ex. 1 may further include accommodating the substrate including the coating film or the semi-solidified film on the surface in the chamber, and pressurizing the inside of the chamber. In this case, due to the pressurizing, the fluidity of the coating film or the semi-solidified film is reduced. As a result, the development of the resist film is promoted, and thus, the resist pattern is less likely to collapse even when the line width is finer.

Ex. 3. The method in Ex. 1 may further include accommodating the substrate including the coating film or the semi-solidified film on the surface in the chamber, and depressurizing the inside of the chamber. In this case, the unnecessary component contained in the coating film or the semi-solidified film is likely to flow out. As a result, it is possible to promote the improvement of the quality of the resist pattern.

Ex. 4. A substrate processing method according to an example of the present disclosure includes forming a coating film by supplying a resist liquid photosensitive to EUV light to a surface of a substrate, forming a semi-solidified film provided with a film drier than the inside of the coating film on the outer surface by volatilizing a solvent from the outer surface portion of the coating film, exposing the semi-solidified film by irradiating the semi-solidified film with EUV light, and supplying a developer to the substrate after the exposure of the semi-solidified film. In this case, as compared with a case where the solidified film after the coating film is solidified by baking (so-called PAB) is exposed, EUV light is likely to act uniformly on the semi-solidified film. In other words, the polymers that constitute the solidified film are relatively strongly bonded to each other, and thus, it is difficult for EUV light to reach the deep portion of the solidified film (the portion of the solidified film in the vicinity of the surface of the substrate). As a result, since the portion that is easily dissolved by the developer and the portion that is difficult to be dissolved by the developer tend to unevenly present in the resist film, the LWR is likely to be large. However, such strong bonding between the polymers substantially does not exist in the semi-solidified film, and thus, EUV light easily reaches the deep portion of the semi-solidified film. Since a predetermined film is provided on, in particular, the outer surface of the semi-solidified film, and the solvent is not volatilized inside the semi-solidified film, the state in which EUV light easily reaches the deep portion of the semi-solidified film is maintained. As a result, since the solubility of the resist film with respect to the developer tends to be uniform, the LWR is likely to be small. Further, according to Ex. 1, since the resist film is likely to be melted uniformly with respect to the developer, the desired line width is implemented even when the dose amount during the exposure is small. That is, since the exposure time by the exposure device is shortened, energy saving during the exposure is promoted and the processing amount (throughput) of the substrate is improved. Further, since a predetermined film is provided on the outer surface of the semi-solidified film, it is extremely difficult for the solvent to be volatilized from the inside of the semi-solidified film. As a result, even when the time taken from the formation of the semi-solidified film to the exposure is different for each substrate, unevenness of the film quality of the semi-solidified film hardly occurs. Therefore, it is possible to suppress the variation of the line width between other substrates. From the above, according to Ex. 4, it is possible to achieve further improvement of the LWR, improvement of productivity, and improvement of the line width uniformity between substrates at the same time.

Ex. 5. In the method of Ex. 4, the forming the semi-solidified film may include accommodating the substrate including the coating film in a depressurized chamber. In this case, due to the depressurizing, the solvent is likely to be volatilized particularly from the outer surface of the coating film. As a result, the semi-solidified film provided with the film on the outer surface may be efficiently formed.

Ex. 6. In the method of Ex. 5, the forming the semi-solidified film may include accommodating the substrate including the coating film in the chamber depressurized at 200 mTorr or less for 90 seconds or more.

Ex. 7. In the method of any one of Ex. 4 to Ex. 6, the forming the semi-solidified film may include flowing a gas on the outer surface of the coating film. In this case, due to the gas flowing on the outer surface of the coating film, the solvent is likely to be volatilized particularly from the outer surface of the coating film. As a result, the semi-solidified film provided with the film on the outer surface may be efficiently formed.

Ex. 8. In the method of Ex. 7, the forming the semi-solidified film may include flowing the gas on the outer surface of the coating film at a flow rate of 4 liter/min or more.

Ex. 9. In the method of any one of Ex. 4 to Ex. 8, the forming the semi-solidified film may include adjusting at least one of an atmosphere temperature or temperature of the substrate so that the atmosphere temperature of the outer surface side of the coating film is higher than the temperature of the substrate including the coating film. In this case, since the temperature of the outer surface of the coating film is relatively high, the solvent is likely to be volatilized from the outer surface of the coating film. As a result, the semi-solidified film provided with the film on the outer surface may be efficiently formed.

Ex. 10. In the method of Ex. 9, the forming the semi-solidified film may include cooling the substrate so that the temperature of the substrate is 23° C. or less. In this case, the temperature of the outer surface of the coating film is likely to be relatively high. As a result, the semi-solidified film provided with the film on the outer surface may be efficiently formed.

Ex. 11. In the method of any one of Ex. 4 to Ex. 10, the forming the semi-solidified film may include supplying a gas heated to 60° C. to 110° C. to the coating film. In this case, the solvent is further promoted to be volatilized from the outer surface of the coating film. As a result, the semi-solidified film provided with the film on the outer surface may be further efficiently formed.

Ex. 12. The method of any one of Ex. 1 to Ex. 11 may further include heating the semi-solidified film after the exposure and before the development. In this case, acid generated in the semi-solidified film due to the exposure is likely to be diffused into the film by heating. As a result, in the subsequent developing processing, the solubility of the resist film with respect to the developer is likely to be more uniform. Therefore, it is possible to promote further improvement of the LWR.

Ex. 13. The method of any one of Ex. 1 to Ex. 12 may further include supplying a polar solvent to the coating film or the semi-solidified film. In this case, during the development, the polar solvent is contained in the resist film. As a result, the polar solvent contained in the resist film serves as a clue for attracting the polar solvent contained in the developer to the resist film together with a developer. Therefore, since the development of the resist film is further promoted, it is possible to promote further improvement of the LWR.

Ex. 14. In the method of Ex. 13, the supplying the polar solvent may include, in the forming the coating film, supplying the coating film mixed with the polar solvent to the surface of the substrate, or supplying the polar solvent and the resist liquid to the surface of the substrate, respectively. In this case, the polar solvent may be contained in the resist film at various timings.

Ex. 15. In the method of Ex. 13 or Ex. 14, the supplying the polar solvent may include supplying the polar solvent in a liquid phase, in a mist phase, or a vapor phase to the coating film or the semi-solidified film.

Ex. 16. In the method of any one of Ex. 13 to Ex. 15, a dipole moment of the polar solvent may be 1.5 debyes to 3.5 debyes. In this case, it is possible to further increase the improvement rate of the LWR.

Ex. 17. In the method of any one of Ex. 1 to Ex. 16, the film thickness of the coating film may be 50 nm or less. In this case, since the solvent contained in the coating film is more likely to be volatilized without heating, the coating film may easily become the semi-solidified film.

Ex. 18. In the method of any one of Ex. 1 to Ex. 17, the forming the semi-solidified film may include volatilizing the solvent contained in the coating film without heating by rotating the substrate. In this case, it is possible to volatilize the solvent contained in the coating film by a very simple method.

Ex. 19. A substrate processing apparatus according to another example of the present disclosure includes: a resist liquid supply configured to form a coating film by supplying a resist liquid photosensitive to EUV light to a surface of a substrate; a volatilizing unit configured to form a semi-solidified film by volatilizing a solvent contained in the coating film without heating; a developing unit configured to supply a developer to the substrate; and a controller. The controller executes a processing of controlling the resist liquid supply so as to form the coating film on the surface of the substrate, a processing of controlling the volatilizing unit so that the coating film becomes the semi-solidified film, and a processing of controlling the developing unit so as to supply the developer to the substrate after irradiating the semi-solidified film with EUV light. In this case, the same effect as in Ex. 1 is exhibited.

Ex. 20. The apparatus of Ex. 19 further includes a pressurizing unit configured to pressurize an inside of a chamber capable of accommodating the substrate, and the controller may further execute a processing of controlling the pressurizing unit so as to pressurize the inside of the chamber in a state where the substrate including the coating film or the semi-solidified film on the surface is accommodated, after the formation of the coating film and before exposure. In this case, the same effect as in Ex. 2 is exhibited.

Ex. 21. The apparatus of Ex. 19 further includes a depressurizing unit configured to depressurize an inside of a chamber capable of accommodating the substrate, and the controller may further execute a processing of controlling the depressurizing unit so as to depressurize the inside of the chamber in a state where the substrate including the coating film or the semi-solidified film on the surface is accommodated, after the formation of the coating film and before exposure. In this case, the same effect as in Ex. 3 is exhibited.

Ex. 22. A substrate processing apparatus according to another example of the present disclosure includes: a resist liquid supply configured to form a coating film by supplying a resist liquid photosensitive to EUV light to a surface of a substrate; a volatilizing unit configured to form a semi-solidified film including a film drier than an inside of the coating film on an outer surface by volatilizing the solvent from an outer surface of the coating film; a developing unit configured to supply a developer to the substrate; and a controller. The controller executes a processing of controlling the resist liquid supply so as to form the coating film on the surface of the substrate, a processing of controlling the volatilizing unit so that the coating film becomes the semi-solidified film, and a processing of controlling the developing unit so as to supply the developer to the substrate after irradiating the semi-solidified film with EUV light. In this case, the same effect as in Ex. 4 is exhibited.

Ex. 23. In the apparatus of Ex. 22, the volatilizing unit is a chamber configured to depressurize the inside, and the processing of controlling the volatilizing unit may include accommodating the substrate including the coating film in the depressurized volatilizing unit. In this case, the same effect as in Ex. 5 is exhibited.

Ex. 24. In the apparatus of Ex. 23, the processing of controlling the volatilizing unit may include accommodating the substrate including the coating film in the volatilizing unit depressurized at 200 mTorr or less for 90 seconds or more.

Ex. 25. In the apparatus of any one of Ex. 22 to Ex. 24, the processing of controlling the volatilizing unit may include flowing a gas on the outer surface of the coating film. In this case, the same effect as in Ex. 7 is exhibited.

Ex. 26. In the apparatus of Ex. 25, the processing of controlling the volatilizing unit may include flowing the gas on the outer surface of the coating film at a flow rate of 4 liter/min or more.

Ex. 27. In the apparatus of any one of Ex. 22 to Ex. 26, the processing of controlling the volatilizing unit may include adjusting at least one of an atmosphere temperature or temperature of the substrate so that the atmosphere temperature of the outer surface side of the coating film is higher than the temperature of the substrate including the coating film. In this case, the same effect as in Ex. 9 is exhibited.

Ex. 28. In the apparatus of Ex. 27, the processing of controlling the volatilizing unit may include cooling the substrate so that the temperature of the substrate is 23° C. or less. In this case, the same effect as in Ex. 9 is exhibited.

Ex. 29. In the apparatus of any one of Ex. 22 to Ex. 28, the processing of controlling the volatilizing unit may include supplying a gas heated to 60° C. to 110° C. to the coating film. In this case, the same effect as in Ex. 12 is exhibited.

Ex. 30. The apparatus of any one of Ex. 19 to Ex. 30 further includes a heating unit configured to heat the semi-solidified film, and the controller may further execute a processing of controlling the heating unit so as to solidify the semi-solidified film after exposure and before development by heating the semi-solidified film. In this case, the same effect as in Ex. 12 is exhibited.

Ex. 31. The apparatus of any one of Ex. 19 to Ex. 30 may further include a polar solvent supply configured to supply a polar solvent to the coating film or the semi-solidified film. In this case, the same effect as in Ex. 13 is exhibited.

Ex. 32. In the apparatus of Ex. 31, the controller may further execute a processing of controlling the resist liquid supply and the polar solvent supply so as to supply a mixed liquid of the polar solvent and the resist liquid to the surface of the substrate, or respectively supply the polar solvent and the resist liquid to the surface of the substrate. In this case, the same effect as in Ex. 14 is exhibited.

Ex. 33. In the apparatus of Ex. 31 or Ex. 32, the polar solvent supply may be configured to supply the polar solvent in a liquid phase, in a mist phase, or a vapor phase to the coating film or the semi-solidified film.

Ex. 34. In the apparatus of any one of Ex. 31 to Ex. 33, a dipole moment of the polar solvent may be 1.5 debyes to 3.5 debyes. In this case, the same effect as in Ex. 16 is exhibited.

Ex. 35. In the apparatus of any one of Ex. 19 to Ex. 34, the film thickness of the coating film may be 50 nm or less. In this case, the same effect as in Ex. 17 is exhibited.

Ex. 36. In the apparatus of any one of Ex. 19 to Ex. 35, the volatilizing unit may be configured to volatilize the solvent contained in the coating film without heating by rotating the substrate. In this case, the same effect as in Ex. 18 is exhibited.

Ex. 37. An example of a computer readable recording medium records a program for executing the substrate processing method of any one of Ex. 1 to Ex. 18 in the substrate processing apparatus. In this case, the same effect as in the method of any one of Ex. 1 to Ex. 18 is exhibited. In the present specification, the computer readable recording medium includes a non-transitory type medium (non-transitory computer recording medium) (e.g., various main storage devices or auxiliary storage devices) or a propagation signal (transitory computer recording medium) (e.g., a data signal that may be provided via a network).

DESCRIPTION OF SYMBOLS

1: substrate processing system (substrate processing apparatus)
2: coating and developing device (substrate processing device)
10: controller (control unit)
16: processing module
17: processing module (developing unit)
20: rotation holder (volatilizing unit)
30: liquid supply (resist liquid supply)
40: liquid supply (polar solvent supply)
L1: processing liquid (resist liquid, developer)
L2: processing liquid (polar solvent)
R1: coating film
R2: semi-solidified film
U1: unit
U2: unit (heating unit)
U3: pressure unit (pressurizing unit, depressurizing unit)
U3a: pressure chamber (chamber)
W: wafer (substrate)
Wa: surface

What is claimed is:

1. A substrate processing method comprising:
forming a coating film on a substrate by supplying a resist liquid photosensitive to extreme ultraviolet (EUV) light and a polar solvent to a surface of the substrate;
forming a semi-solidified film by volatilizing a solvent contained in the coating film without heating the solvent;
irradiating the semi-solidified film with EUV light to expose the semi-solidified film; and
supplying a developer to the substrate after the semi-solidified film is exposed.

2. A substrate processing method comprising:
forming a coating film on a substrate by supplying a resist liquid photosensitive to extreme ultraviolet (EUV) light and a polar solvent to a surface of the substrate;
forming a semi-solidified film including a film drier than an inside of the coating film on an outer surface of the coating film, by volatilizing a solvent from the outer surface of the coating film;
irradiating the semi-solidified film with EUV light to expose the semi-solidified film; and
supplying a developer to the substrate after the semi-solidified film is exposed.

3. The substrate processing method according to claim 2, wherein the forming the semi-solidified film includes accommodating the substrate on which the coating film is formed, in a chamber that is depressurized.

4. The substrate processing method according to claim 3, wherein the chamber is depressurized at 200 mTorr or less for 90 seconds or longer.

5. The substrate processing method according to claim 2, wherein the forming the semi-solidified film includes flowing a gas on the outer surface of the coating film.

6. A substrate processing apparatus comprising:
a resist liquid supply configured to supply a resist liquid photosensitive to extreme ultraviolet (EUV) light to a surface of a substrate;
a polar solvent supply configured to supply a polar solvent to the surface of the substrate;
a volatilizer configured to volatilize a solvent contained in a coating film without heating the solvent, thereby forming a semi-solidified film;
a developer supply configured to supply a developer to the substrate; and
a controller,
wherein the controller is configured to execute:
a control process of the resist liquid supply and the polar solvent supply to supply the resist liquid and the polar solvent to the substrate, respectively, to form the coating film on the surface of the substrate,
a control process of the volatilizer such that the coating film becomes the semi-solidified film, and
a control process of the developer supply to supply the developer to the substrate after irradiating the semi-solidified film with EUV light.

7. A substrate processing apparatus comprising:
a resist liquid supply configured to supply a resist liquid photosensitive to extreme ultraviolet (EUV) light to a surface of a substrate;
a polar solvent supply configured to supply a polar solvent to the surface of the substrate;
a volatilizer configured to volatilize a solvent contained in a coating film to form a semi-solidified film including a film drier than an inside of the coating film on an outer surface of the coating film, by volatilizing the solvent from the outer surface of the coating film;
a developer supply configured to supply a developer to the substrate; and
a controller,
wherein the controller is configured to execute:
a control process of the resist liquid supply and the polar solvent supply to supply the resist liquid and the polar solvent to the substrate, respectively, to form the coating film on the surface of the substrate,
a control process of the volatilizer such that the coating film becomes the semi-solidified film, and
a control process of the developer supply so as to supply the developer to the substrate after irradiating the semi-solidified film with EUV light.

8. The substrate processing apparatus according to claim 7, wherein the volatilizer is a chamber configured to be depressurizable, and
the control process of the volatilizer includes accommodating the substrate on which the coating film is formed in the chamber that is depressurized.

9. The substrate processing apparatus according to claim 8, wherein the chamber is depressurized at 200 mTorr or less for 90 seconds or longer.

10. The substrate processing apparatus according to claim 7, wherein the control process of the volatilizer includes flowing a gas on the outer surface of the coating film.

11. The substrate processing apparatus according to claim 10, wherein the control process of the volatilizer flows the gas on the outer surface of the coating film at a flow rate of 4 liter/min or more.

12. The substrate processing apparatus according to claim 7, wherein the control process of the volatilizer includes adjusting at least one of an atmosphere temperature on the outer surface side of the coating film and a temperature of the substrate such that the atmosphere temperature is higher than the temperature of the substrate on which the coating film is formed.

13. The substrate processing apparatus according to claim 12, wherein the control process of the volatilizer includes cooling the substrate such that the temperature of the substrate is 23° C. or less.

14. The substrate processing apparatus according to claim 7, wherein the control process of volatilizer includes supplying a gas heated to 60° C. to 110° C. to the coating film.

15. The substrate processing apparatus according to claim 6, further comprising:
a heater configured to heat the semi-solidified film,
wherein the controller further executes a control process of the heater to heat the semi-solidified film after the irradiating the semi-solidified film with EUV light for an exposure but before the developer is supplied to the substrate for a development of the semi-solidified film, thereby solidifying the semi-solidified film.

16. The substrate processing apparatus according to claim 6, wherein the control process of the resist liquid supply and the polar solvent supply includes supplying a mixed liquid of the polar solvent and the resist liquid to the surface of the substrate, or supplying the polar solvent to the surface of the substrate separately from the resist liquid.

17. The substrate processing apparatus according to claim 6, wherein the polar solvent supply is configured to supply the polar solvent in a liquid phase, a mist phase, or a vapor phase to the coating film or to the semi-solidified film.

18. The substrate processing apparatus according to claim 6, wherein a dipole moment of the polar solvent is 1.5 debyes to 3.5 debyes.

19. A non-transitory computer-readable recording medium having stored therein a program that executes the substrate processing method according to claim 1 in a substrate processing apparatus.

* * * * *